(12) United States Patent
Yonemori et al.

(10) Patent No.: US 11,640,860 B2
(45) Date of Patent: *May 2, 2023

(54) CIRCUIT MODULE AND INTERPOSER

(71) Applicant: Murata Manufacturing Co., Ltd., Nagaokakyo (JP)

(72) Inventors: Keito Yonemori, Nagaokakyo (JP); Hirokazu Yazaki, Nagaokakyo (JP); Takanori Tsuchiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/881,703

(22) Filed: Aug. 5, 2022

(65) Prior Publication Data
US 2022/0377893 A1 Nov. 24, 2022

Related U.S. Application Data

(63) Continuation of application No. 16/513,839, filed on Jul. 17, 2019, now Pat. No. 11,450,451, which is a (Continued)

(30) Foreign Application Priority Data

Jan. 27, 2017 (JP) .............................. JP2017-013532

(51) Int. Cl.
*H01B 7/08* (2006.01)
*H01L 23/495* (2006.01)
(Continued)

(52) U.S. Cl.
CPC ......... *H01B 7/08* (2013.01); *H01L 23/49531* (2013.01); *H01R 12/52* (2013.01);
(Continued)

(58) Field of Classification Search
CPC ....................................................... H01B 7/08
(Continued)

(56) References Cited

U.S. PATENT DOCUMENTS

| 2012/0052699 A1* | 3/2012 | MacDougall | .... H01R 13/65915 439/55 |
| 2013/0001798 A1* | 1/2013 | Choi | ....................... H01L 24/17 257/774 |

(Continued)

OTHER PUBLICATIONS

Yonemori et al., "Circuit Module and Interposer", U.S. Appl. No. 16/513,839, filed Jul. 17, 2019.

*Primary Examiner* — Stanley Tso
(74) *Attorney, Agent, or Firm* — Keating & Bennett, LLP

(57) ABSTRACT

A circuit module includes an interposer, and the interposer includes an element body including a first surface, a first interposer terminal provided on the first surface of the element body, and connected to a first external element, a second interposer terminal provided on the first surface of the element body, and connected to a second external element, a first wiring provided in the element body, and electrically connecting the first interposer terminal and the circuit board with each other, a second wiring provided in the element body, and electrically connecting the second interposer terminal and the circuit board with each other, and a bypass wiring provided in the element body and/or on a surface of the element body, and electrically connecting the first interposer terminal and the second interposer terminal with each other.

4 Claims, 30 Drawing Sheets

Related U.S. Application Data continuation of application No. PCT/JP2017/042931, filed on Nov. 30, 2017.

(51) Int. Cl.
    *H05K 1/02* (2006.01)
    *H01R 12/52* (2011.01)
    *H01R 12/57* (2011.01)
    *H01R 12/62* (2011.01)
    *H05K 1/14* (2006.01)
    *H05K 1/18* (2006.01)
    *H05K 3/36* (2006.01)

(52) U.S. Cl.
    CPC ............. *H01R 12/57* (2013.01); *H01R 12/62* (2013.01); *H05K 1/0201* (2013.01); *H05K 1/0221* (2013.01); *H05K 1/141* (2013.01); *H05K 1/148* (2013.01); *H05K 1/181* (2013.01); *H05K 3/36* (2013.01); *H01B 7/0838* (2013.01); *H05K 2201/09672* (2013.01); *H05K 2201/1053* (2013.01); *H05K 2201/10356* (2013.01); *H05K 2201/10378* (2013.01); *H05K 2203/176* (2013.01)

(58) Field of Classification Search
    USPC ...................................................... 174/117 F
    See application file for complete search history.

(56) References Cited

U.S. PATENT DOCUMENTS

2017/0047308 A1* 2/2017 Ho .................... H01L 23/5386
2018/0331036 A1* 11/2018 Zhang ................. H05K 1/0219

* cited by examiner

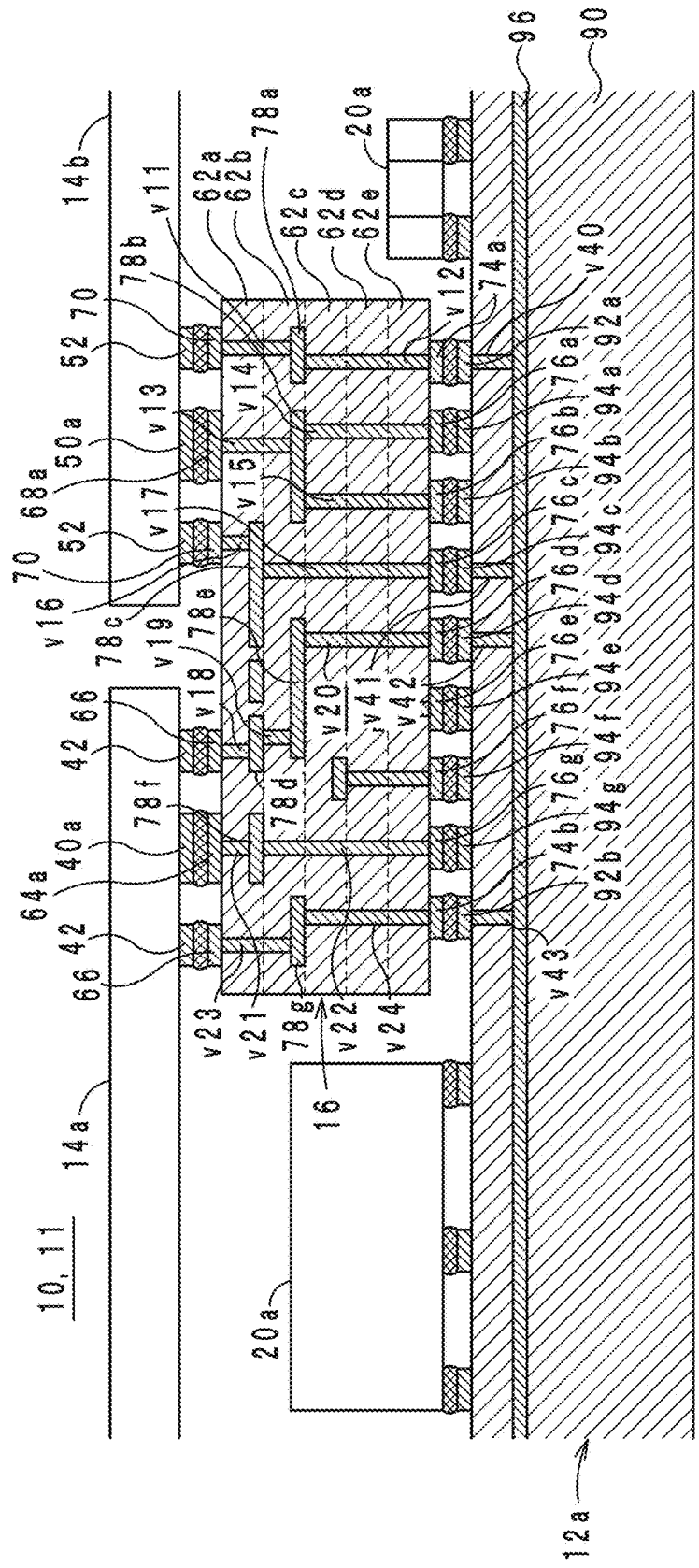
Fig. 4

Fig. 7
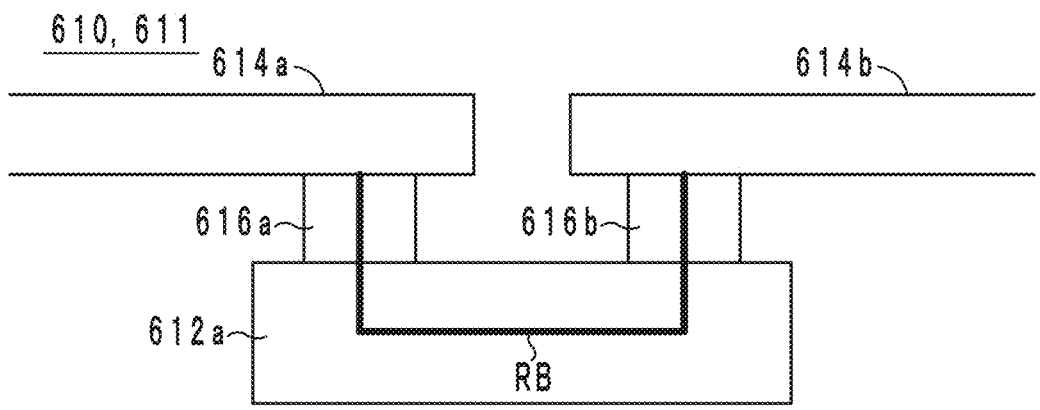
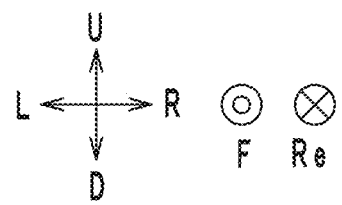

Fig.11
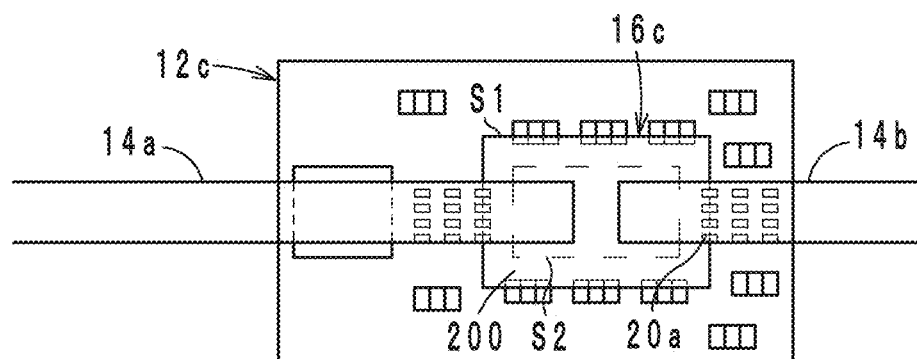
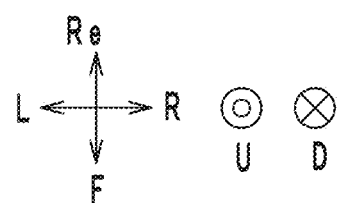

Fig.15
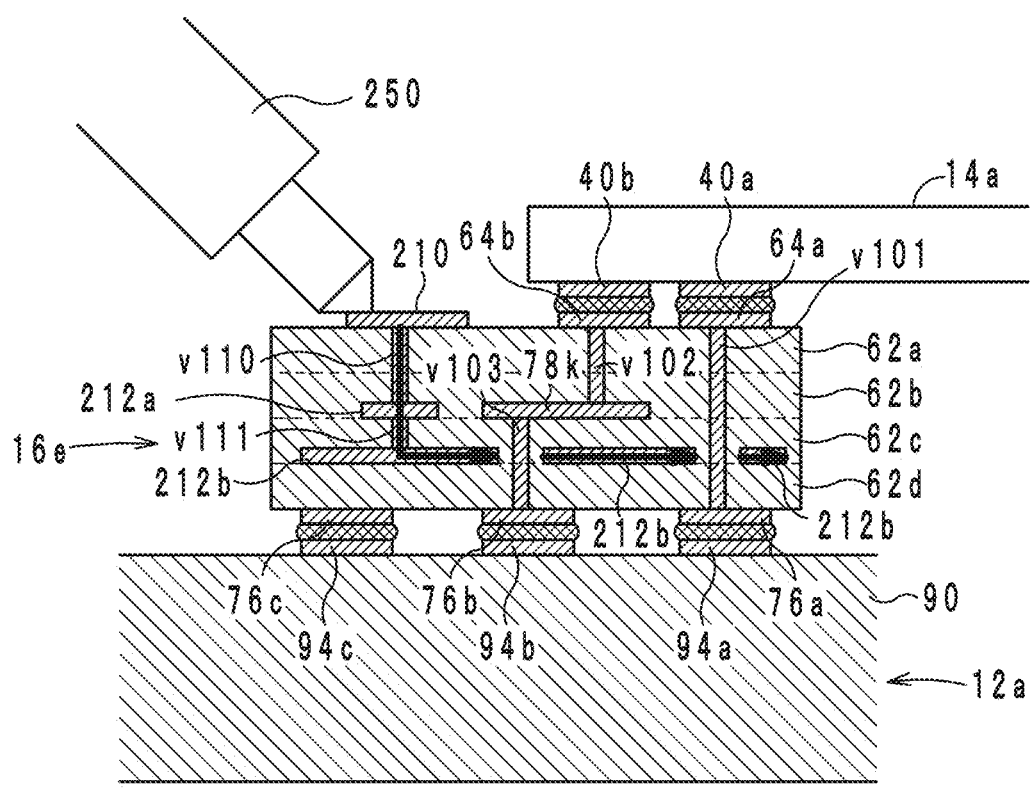
R15 : v101  60 : 62a–62d
R16 : v102, v103, 78k
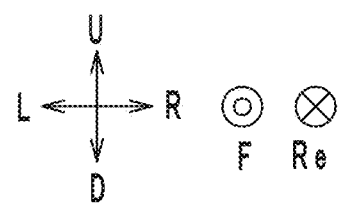

Fig. 16
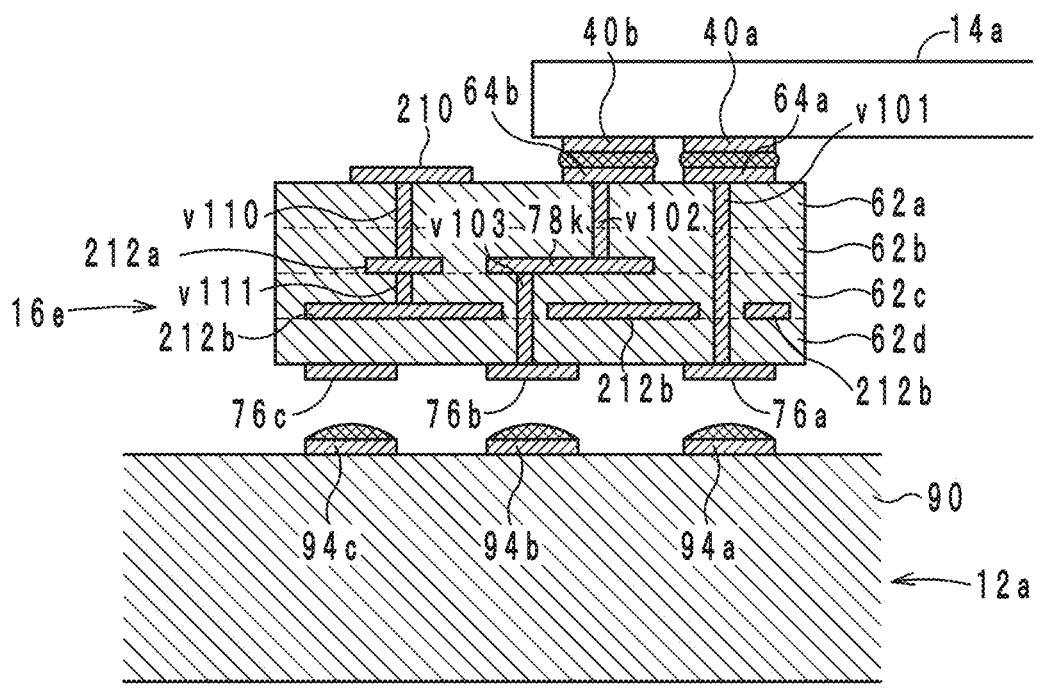
R15: v101   60: 62a-62d
R16: v102, v103, 78k
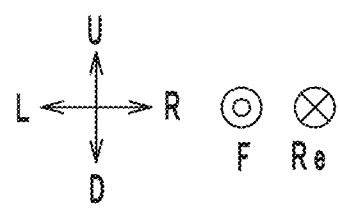

Fig.19
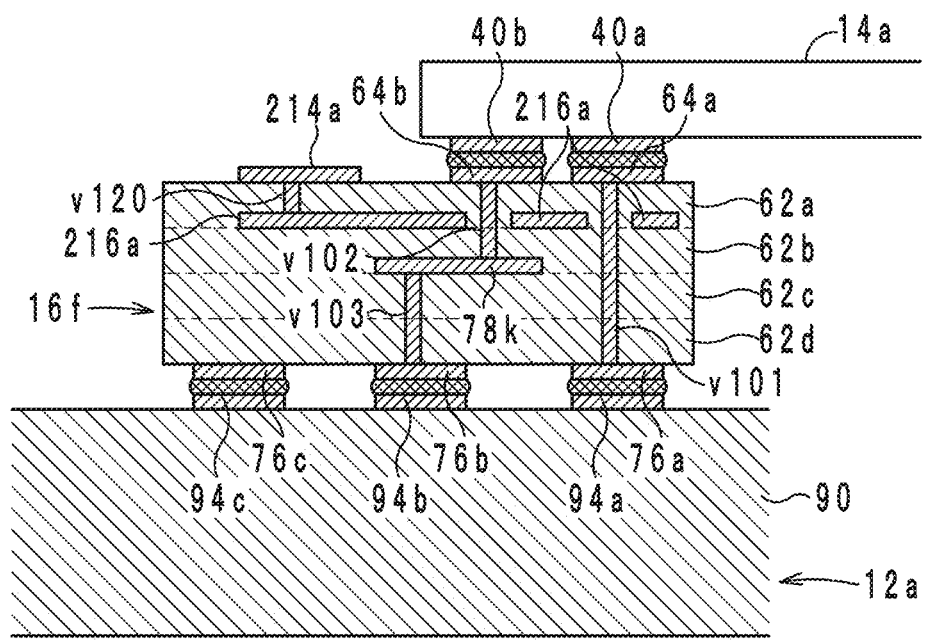
R15: v101   60: 62a-62d
R16: v102, v103, 78k
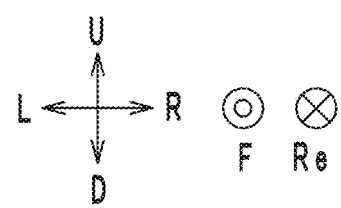

Fig. 20
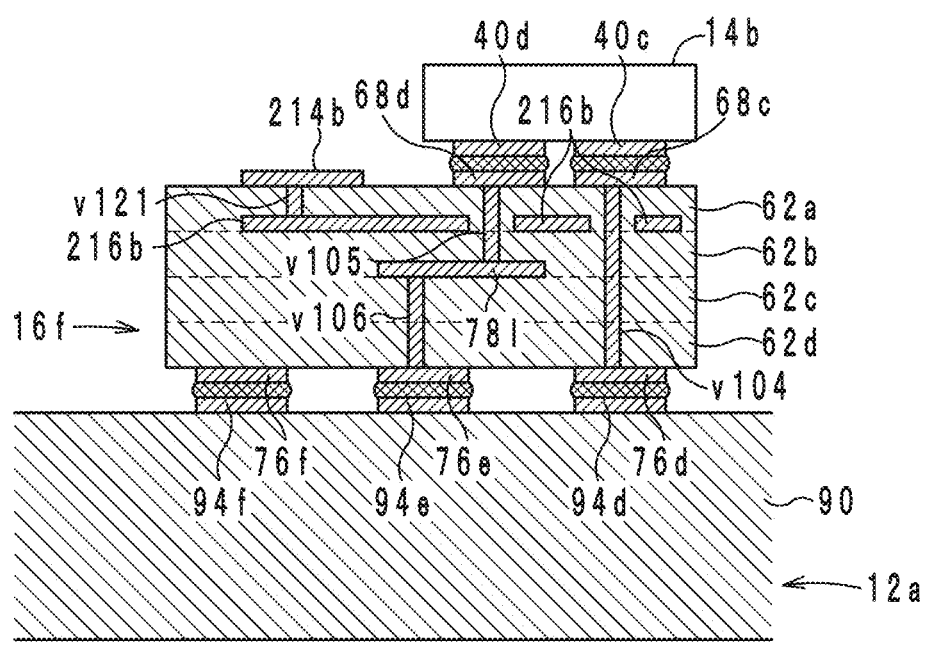
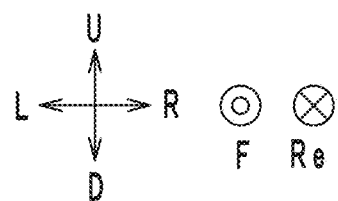

Fig.22
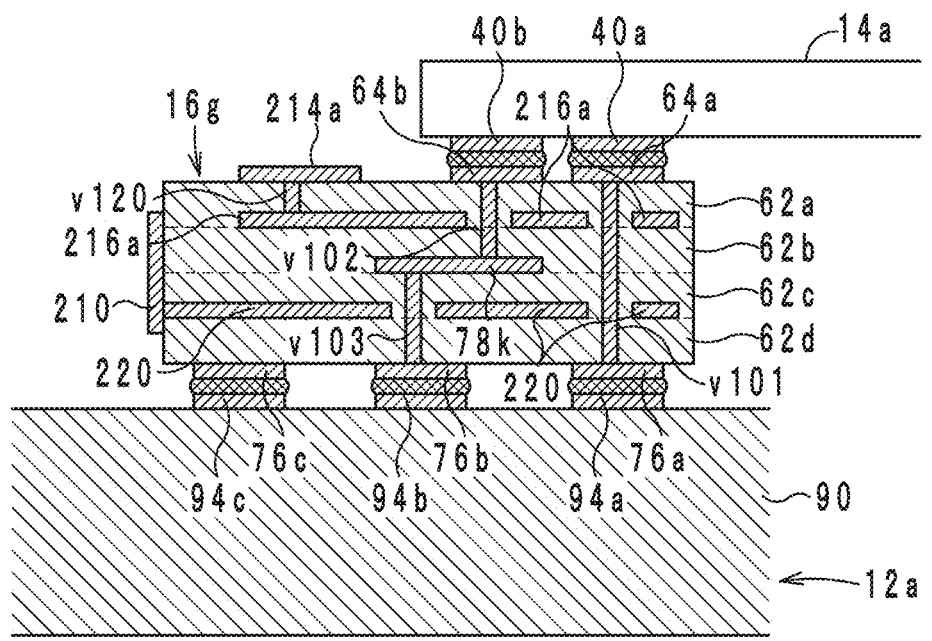
R15: v101  60: 62a-62d
R16: v102, v103, 78k
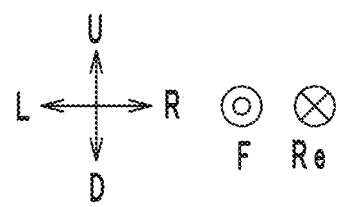

Fig.29
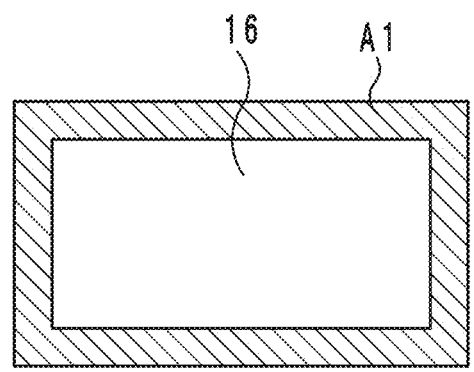
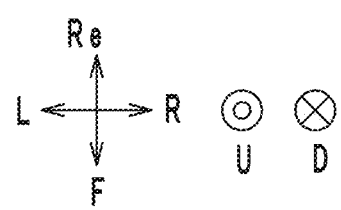

Fig.30
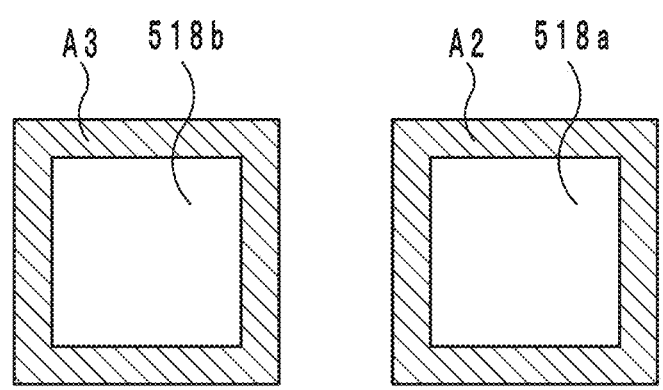
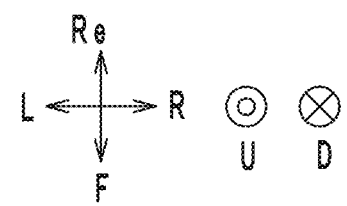

CIRCUIT MODULE AND INTERPOSER

CROSS REFERENCE TO RELATED APPLICATIONS

This application claims the benefit of priority to Japanese Patent Application No. 2017-013532 filed on Jan. 27, 2017 and is a Continuation Application of PCT Application No. PCT/JP2017/042931 filed on Nov. 30, 2017. The entire contents of each application are hereby incorporated herein by reference.

BACKGROUND OF THE INVENTION

1. Field of the Invention

The present invention relates to a circuit module which includes an interposer used for the connection between a circuit board and an external element, and to the interposer.

2. Description of the Related Art

As an invention relating to conventional electronic device, an electronic device described in Japanese Patent No. 5842850 is known, for example. The electronic device described in Japanese Patent No. 5842850 includes two mounting circuit boards, a flat cable, two male connectors, and two female connectors. The two male connectors are respectively mounted on the two mounting circuit boards. The two female connectors are respectively mounted on both ends of the flat cable, which is one example of an external element. The two male connectors are connected with the two female connectors respectively so that the two mounting circuit boards are electrically connected with each other through the flat cable.

In the electronic device described in Japanese Patent No. 5842850, the male connector and the female connector have a structure where ground terminals and signal terminals are molded by a resin. Accordingly, the male connector and the female connector are manufactured through a step of forming the ground terminals and the signal terminals by bending a sheet metal, and a step of forming the ground terminals and the signal terminals into an integral body by resin molding. Such a bending step and a resin molding step require a complicated processing technique. For this reason, it is difficult to reduce the size of the male connector and the female connector.

In view of the above, there is proposed a method for connecting and fixing a cable described in International Application Publication No. WO2014/002757. In the method for connecting and fixing a cable described in International Application Publication No. WO2014/002757, a guide member is used in place of the male connectors and the female connectors. To be more specific, the guide member is mounted on a printed circuit board with solder. Further, a cable is connected to the guide member with solder. The guide member includes linear conductors and via hole conductors which electrically connect the cable and the printed circuit board with each other. With such a configuration, the cable and the printed circuit board are electrically connected with each other through the guide member.

The guide member having the above-described configuration has a stacked structure. Accordingly, the guide member is manufactured through a printing step where a conductor layer is printed on an insulator layer, and a lamination step where insulator layers are stacked. Such a printing step and a lamination step (so-called sheet lamination process) are suitable for manufacturing a large number of small components compared with the bending step and the resin molding step. Accordingly, the size of the guide member can be reduced more easily than reducing the size of the male connector and the female connector.

Recently, there are an increasing number of cases in which three or more circuit boards are connected with each other through flat cables in an electronic device, such as in a smartphone. The description will be made with reference to the example of the case in which a circuit board A, a circuit board B, and a circuit board C are connected with each other through flat cables by the method for connecting and fixing a cable described in International Application Publication No. WO2014/002757, for example. In this case, following three flat cables are necessary.

Flat cable A: connecting the circuit board A and the circuit board B with each other Flat cable B: connecting the circuit board B and the circuit board C with each other Flat cable C: connecting the circuit board C and the circuit board A with each other In addition to the above, the following six guide members are necessary.

Guide member A: connecting the flat cable A and the circuit board A with each other Guide member B: connecting the flat cable A and the circuit board B with each other Guide member C: connecting the flat cable B and the circuit board B with each other Guide member D: connecting the flat cable B and the circuit board C with each other Guide member E: connecting the flat cable C and the circuit board C with each other Guide member F: connecting the flat cable C and the circuit board A with each other As described above, the six guide members are necessary to connect the three circuit boards with each other through the flat cables by the method for connecting and fixing a cable described in International Application Publication No. WO2014/002757. Such a configuration increases an area occupied by the guide members in each circuit board. When the number of circuit boards further increases, the number of guide members also further increases, thus further increasing an area occupied by the guide members in each circuit board.

SUMMARY OF THE INVENTION

Preferred embodiments of the present invention provide interposers and circuit modules, each of which make it possible to reduce the area of a region that connects a circuit board and an external element with each other.

According to a preferred embodiment of the present invention, there is provided a circuit module including a circuit board including a main surface, and an interposer mounted on the main surface of the circuit board. The interposer includes an element body including a first surface, a first interposer terminal and a third interposer terminal provided on the first surface of the element body and connected to a first external element, a second interposer terminal and a fourth interposer terminal provided on the first surface of the element body and connected to a second external element, at least one of a first wiring and a second wiring, and a bypass wiring. The first wiring is provided in the element body and/or on a surface of the element body, and electrically connects the first interposer terminal and the circuit board with each other. The second wiring is provided in the element body and/or on the surface of the element body, and electrically connects the second interposer terminal and the circuit board with each other. The bypass wiring is provided in the element body and/or on a surface of the element body, and electrically connects the third interposer terminal and the fourth interposer terminal with each other.

According to a preferred embodiment of the present invention, there is provided an interposer used in a circuit module including a circuit board including a main surface, a first external element, and a second external element, the interposer including an element body including a first surface, a first interposer terminal provided on the first surface and connected to the first external element, a second interposer terminal provided on the first surface and connected to the second external element, at least one of a first wiring and a second wiring, and a bypass wiring. The first wiring is provided in the element body and/or on a surface of the element body, and electrically connects the first interposer terminal and the circuit board with each other. The second wiring is provided in the element body and/or on the surface of the element body, and electrically connects the second interposer terminal and the circuit board with each other. The bypass wiring is provided in the element body and/or on a surface of the element body, and electrically connects the first interposer terminal and the second interposer terminal with each other.

According to preferred embodiments of the present invention, it is possible to reduce the area of a region that connects the circuit board and the external element with each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a cross-sectional view taken along a line A-A in FIG. 3.

FIG. 7 is a cross-sectional view of an area in the vicinity of interposers 616a, 616b of electronic device 610 according to the Comparative Example.

FIG. 11 is a view of an electronic device 10c according to a preferred embodiment of the present invention as viewed from above.

FIG. 15 is a cross-sectional view taken along a line C-C in FIG. 13.

FIG. 16 is a cross-sectional view taken along a line C-C in FIG. 13.

FIG. 19 is a cross-sectional view taken along a line D-D in FIG. 17.

FIG. 20 is a cross-sectional view taken along a line E-E in FIG. 17.

FIG. 22 is a cross-sectional view of an electronic device 10g which includes the interposer 16g according to a preferred embodiment of the present invention.

FIG. 29 is a view of an interposer 16 according to a preferred embodiment of the present invention as viewed from above.

FIG. 30 is a view of guide members 518a, 518b according to a preferred embodiment of the present invention as viewed from above.

DETAILED DESCRIPTION OF THE PREFERRED EMBODIMENTS

Preferred embodiments of the present invention will be described in detail below with reference to the accompanying drawings.

Figure 1:
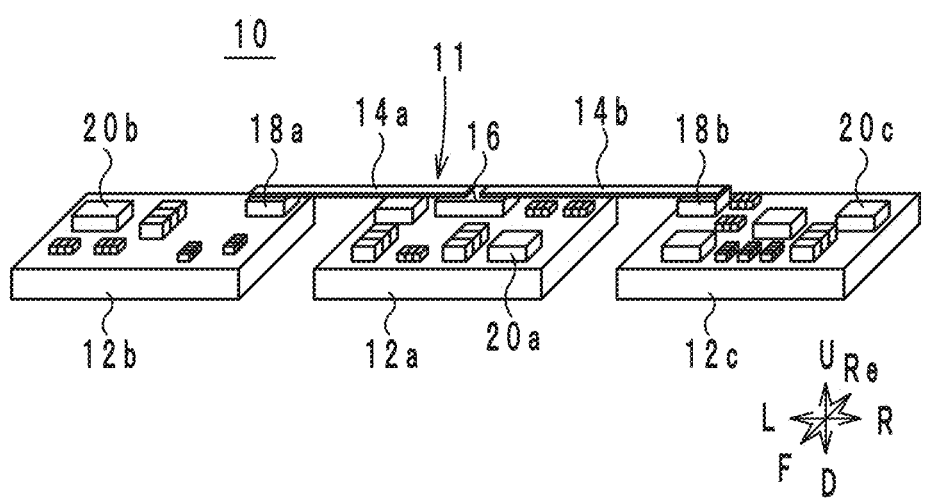
FIG. 1 is a perspective view of an electronic device 10 according to a preferred embodiment of the present invention.
Figure 2:
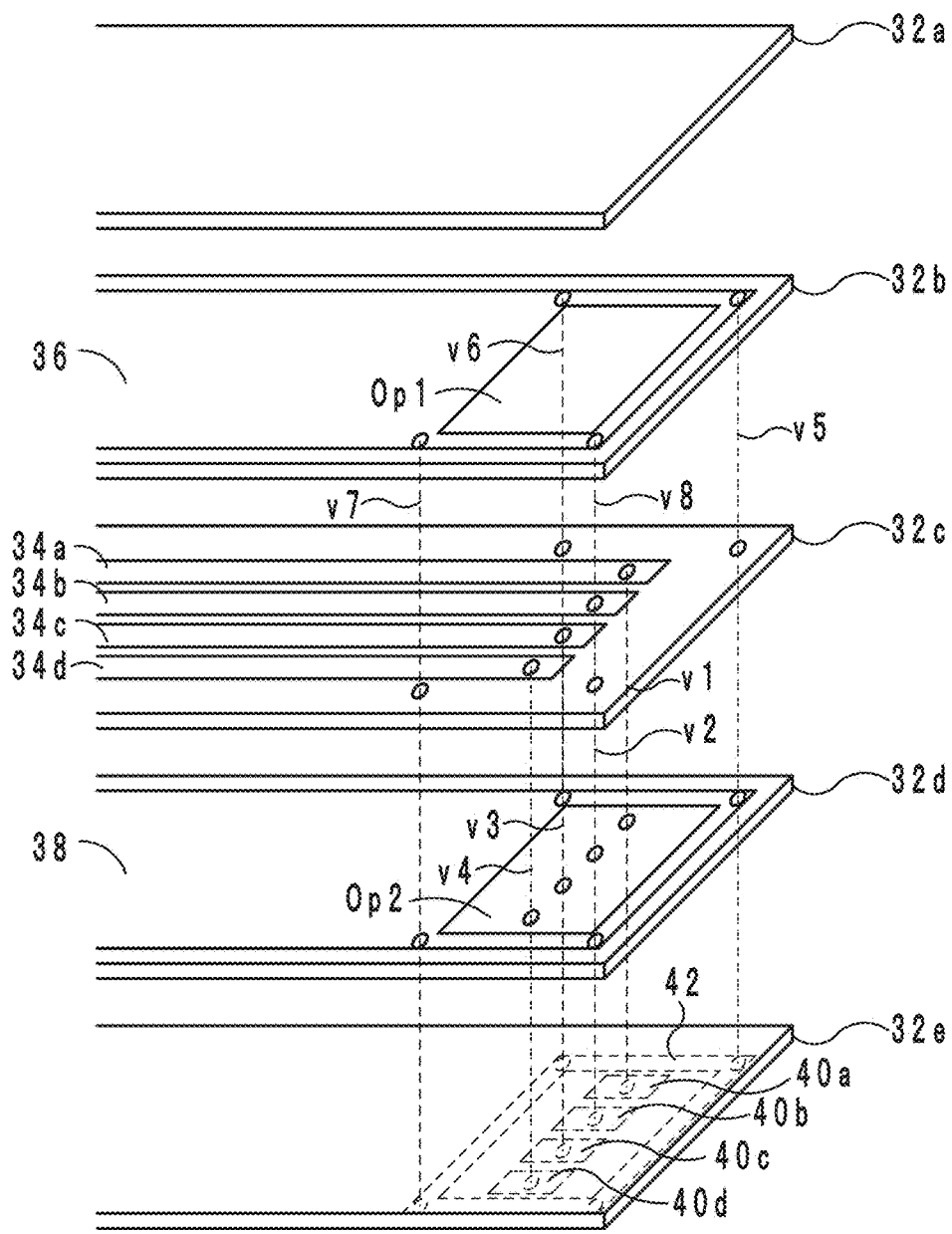
FIG. 2 is an exploded perspective view of a flat cable 14a according to a preferred embodiment of the present invention.

Hereinafter, a configuration of an electronic device 10 according to a preferred embodiment will be described with reference to drawings. FIG. 1 is a perspective view of the electronic device 10. In FIG. 1, a portion of the internal structure of the electronic device 10 is shown, but a casing, a battery, and the like are omitted. FIG. 2 is an exploded perspective view of a flat cable 14a.

A circuit board 12a preferably has a rectangular or substantially rectangular plate shape. A direction orthogonal or substantially orthogonal to the circuit board 12a is defined as an up-down direction. A direction along which the long sides of the circuit board 12a extend when the circuit board 12a is viewed from above is defined as a right-left direction. Further, a direction along which the short sides of the circuit board 12a extend when the circuit board 12a is viewed from above is defined as a front-rear direction. The up-down direction, the right-left direction, and the front-rear direction merely provide one example. Accordingly, the up-down direction, the right-left direction, and the front-rear direction when the electronic device 10 is used may differ from the up-down direction, the right-left direction, and the front-rear direction shown in FIG. 1.

The electronic device 10 is preferably a radio communication device, such as a smartphone, for example. As shown in FIG. 1, the electronic device 10 includes a circuit module 11. The electronic device 10 also preferably includes a casing, a battery and the like not shown in the drawing in addition to the circuit module 11. The circuit module 11 preferably includes the circuit boards 12a to 12c, the flat cables 14a, 14b, interposers 16, 18a, 18b, a plurality of electronic components 20a, a plurality of electronic components 20b, and a plurality of electronic components 20c.

Each of the circuit boards 12a to 12c is preferably a printed circuit board including circuits in and on the surface thereof. The circuit boards 12a to 12c preferably have a rectangular or substantially rectangular plate shape as viewed from above. Accordingly, each of the circuit boards 12a to 12c includes an upper surface (one example of a main surface) and a lower surface. The circuit boards 12b, 12a, 12c are arranged in one row in this order from the left to the right.

The plurality of electronic components 20a (one example of a first electronic component) are mounted on the upper surface of the circuit board 12a. The plurality of electronic components 20b are mounted on the upper surface of the circuit board 12b. The plurality of electronic components 20c are mounted on the upper surface of the circuit board 12c. The plurality of electronic components 20a to 20c are preferably active components, such as, for example, semiconductor integrated circuits, and passive components, such as chip components. In FIG. 1, reference numerals are provided only to representative electronic components 20a to 20c from among the plurality of electronic components 20a to 20c.

As shown in FIG. 1, the flat cables 14a, 14b (the flat cable 14a is one example of a first flat cable and a first external element, and the flat cable 14b is one example of a second flat cable and a second external element) are preferably high-frequency signal lines having flexibility. The flat cables 14a, 14b preferably have a linear plate shape which extends in the right-left direction. Hereinafter, the structure of the flat cable 14a will be described with reference to FIG. 2.

As shown in FIG. 2, the flat cable 14a preferably includes a dielectric element body 30, signal lines 34a to 34d, ground conductors 36, 38 (one example of a first ground conductor), cable terminals 40a to 40d, 42 (one example of a first cable terminal), and via hole conductors v1 to v8.

As shown in FIG. 2, the dielectric element body 30 extends in the right-left direction as viewed from above. As shown in FIG. 2, the dielectric element body 30 is a stack in which dielectric sheets 32a to 32e are stacked in this order from the top to the bottom. The dielectric element body 30 has flexibility.

The dielectric sheets 32a to 32e extend in the right-left direction as viewed from above, and preferably have a shape the same or substantially the same as that of the dielectric element body 30. The dielectric sheets 32a to 32e are preferably made of a thermoplastic resin having flexibility, such as, for example, polyimide or liquid crystal polymer. The dielectric sheets 32a to 32e are preferably formed into an integral body by thermocompression bonding.

As shown in FIG. 2, the signal lines 34a to 34d are provided on the upper surface of the dielectric sheet 32c. The signal lines 34a to 34d are linear conductor layers which extend in the right-left direction. The signal lines 34a to 34d are arranged at equal or substantially equal intervals in this order from the rear side to the front side.

As shown in FIG. 2, the ground conductor 36 is preferably provided on the upper surface of the dielectric sheet 32b. The ground conductor 36 is preferably a solid conductor layer which covers the entire or substantially the entire surface of the dielectric sheet 32b. Accordingly, the ground conductor 36 overlaps with the signal lines 34a to 34d as viewed from above. A rectangular opening Op1 is preferably provided in the right end of the ground conductor 36. The conductor layer is not provided to the opening Op1. Therefore, the right ends of the signal lines 34a to 34d overlap with the opening Op1 so that the right ends of the signal lines 34a to 34d do not overlap with the ground conductor 36. It may also be configured such that the ground conductor 36 includes a plurality of openings which overlap with the signal lines 34a to 34d, and which are arranged in the right-left direction.

As shown in FIG. 2, the ground conductor 38 is provided on the upper surface of the dielectric sheet 32d. The ground conductor 38 is preferably a solid conductor layer which covers an entire or substantially the entire surface of the dielectric sheet 32d. Accordingly, the ground conductor 38 overlaps with the signal lines 34a to 34d as viewed from above. A rectangular opening Op2 is preferably defined in the right end of the ground conductor 38. The conductor layer is not provided to the opening Op2. Therefore, the right ends of the signal lines 34a to 34d overlap with the opening Op2 so that the right ends of the signal lines 34a to 34d do not overlap with the ground conductor 38.

As described above, the signal lines 34a to 34d are sandwiched between the ground conductors 36, 38 from the upper and lower sides. Accordingly, the signal lines 34a to 34d and the ground conductors 36, 38 define a strip-line structure.

As shown in FIG. 2, the cable terminals 40a to 40d are preferably provided on the lower surface of the dielectric sheet 32e. The cable terminals 40a to 40d are preferably rectangular or substantially rectangular conductor layers. The cable terminals 40a to 40d are arranged in this order from the rear side to the front side. The cable terminals 40a to 40d respectively overlap with the right ends of the signal lines 34a to 34d as viewed from above.

As shown in FIG. 2, the cable terminal 42 is provided on the lower surface of the dielectric sheet 32e. The cable terminal 42 is preferably a conductor layer having a rectangular or substantially rectangular frame shape. The cable terminal 42 surrounds the cable terminals 40a to 40d as viewed from above.

The via hole conductors v1 to v4 penetrate the dielectric sheets 32c to 32e in the up-down direction. The via hole conductor v1 connects the right end of the signal line 34a with the cable terminal 40a. The via hole conductor v2 connects the right end of the signal line 34b with the cable terminal 40b. The via hole conductor v3 connects the right end of the signal line 34c with the cable terminal 40c. The via hole conductor v4 connects the right end of the signal line 34d with the cable terminal 40d. With such a configuration, the cable terminals 40a to 40d define and function as input/output terminals through which a high frequency signal is input and output.

The via hole conductors v5 to v8 penetrate the dielectric sheets 32b to 32e in the up-down direction. The via hole conductors v5 to v8 connect the ground conductors 36, 38 with the cable terminal 42. With such a configuration, the cable terminal 42 defines and functions as a ground terminal connected to the ground potential.

The signal lines 34a to 34d, the ground conductors 36, 38, and the via hole conductors v1 to v8 are preferably made of, for example, a metal material which contains Ag, Cu, and Al as a main component, and which has small resistivity. Further, the cable terminals 40a to 40d, 42 are preferably formed by applying Ni plating and Sn plating to a base made of a metal material which contains Ag, Cu, and Al as a main component. Ni plating and Au plating, Ni plating and Cu plating, or Ni plating and Ag plating may be applied, instead of applying Ni plating and Sn plating.

The structure of the left end of the flat cable 14a is preferably the same or substantially the same as the structure of the right end of the flat cable 14a and thus, the description of the left end of the flat cable 14a is omitted. The structure of the flat cable 14b is preferably the same or substantially the same as the structure of the flat cable 14a and thus, the description of the flat cable 14b is omitted.

Figure 3:
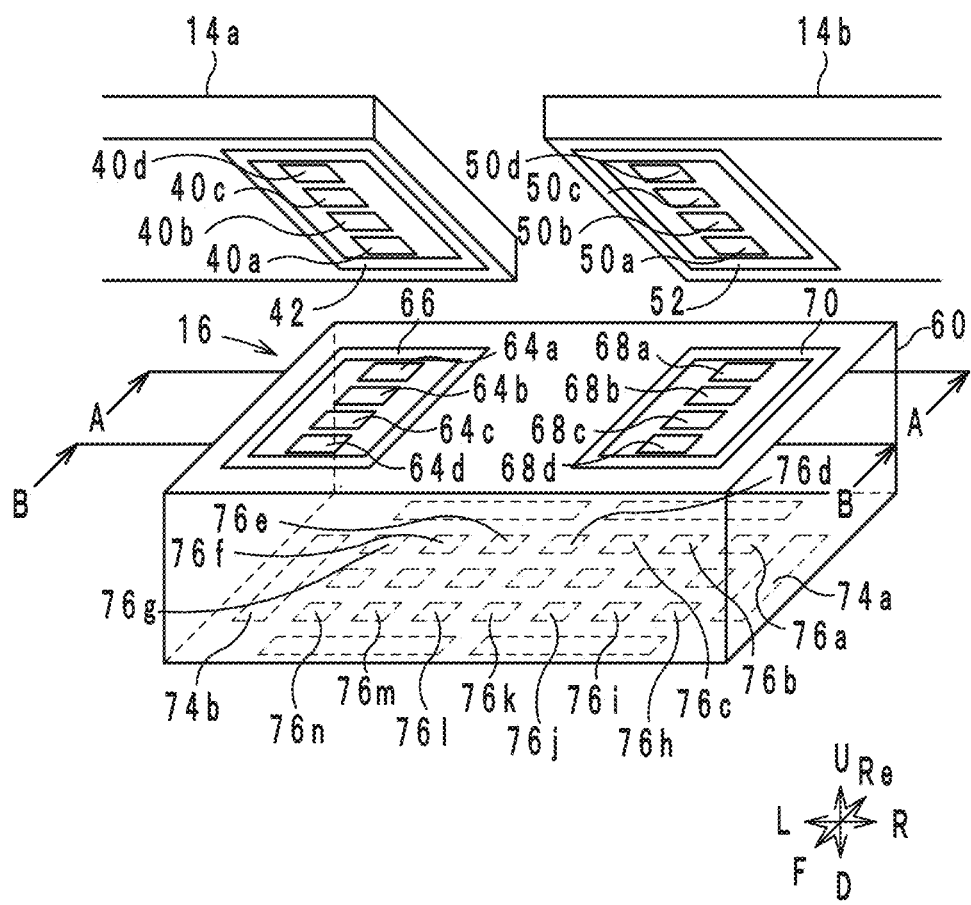
FIG. 3 is a perspective view showing flat cables 14a, 14b and an interposer 16 according to a preferred embodiment of the present invention.
Figure 5:
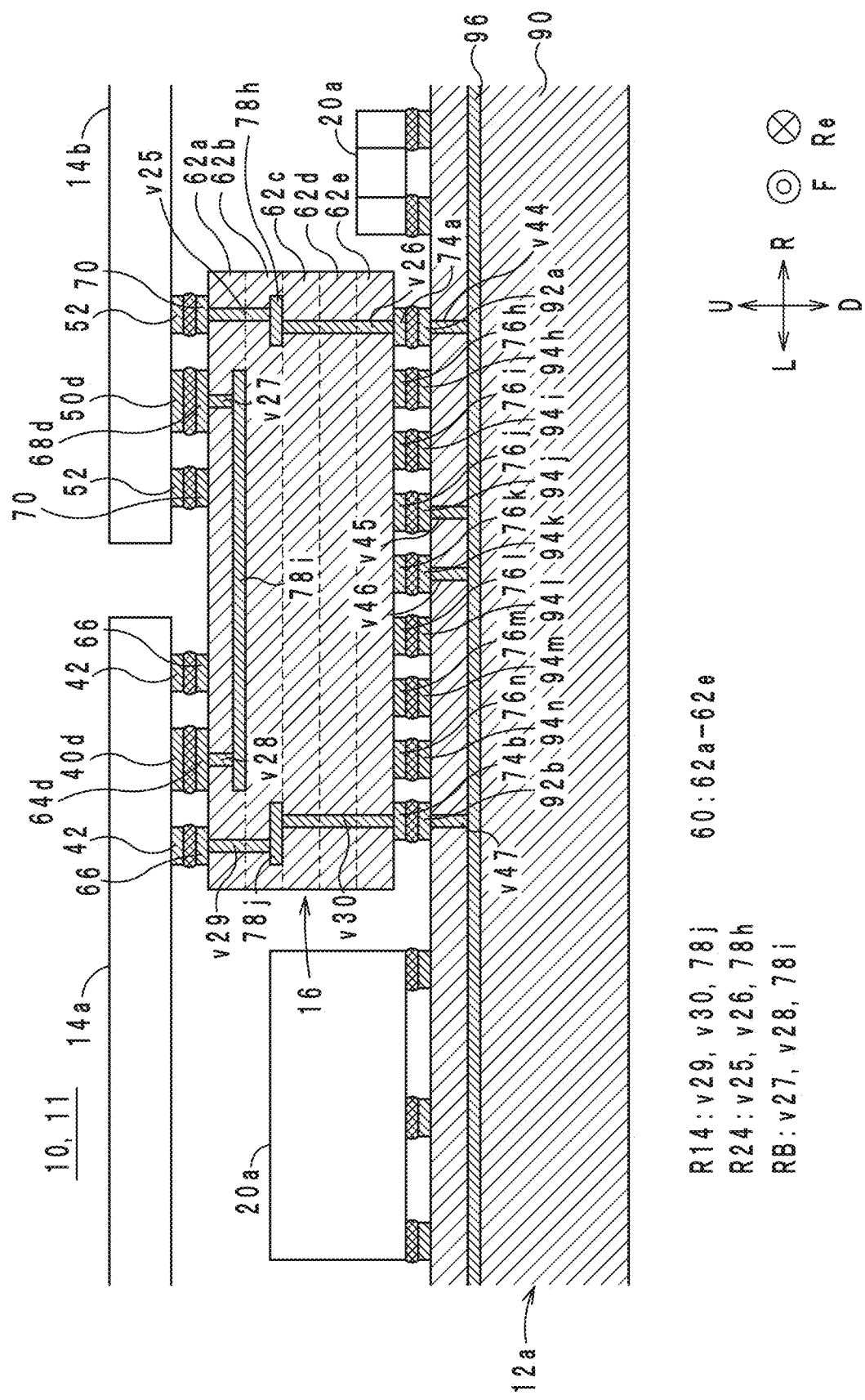
FIG. 5 is a cross-sectional view taken along a line B-B in FIG. 3.

Next, the configuration of the interposer 16 will be described with reference to drawings. FIG. 3 is a perspective view showing the flat cables 14a, 14b and the interposer 16. FIG. 4 is a cross-sectional view taken along a line A-A in FIG. 2. FIG. 5 is a cross-sectional view taken along a line B-B in FIG. 2.

As shown in FIG. 3 to FIG. 5, the interposer 16 preferably includes an element body 60, interposer terminals 64a to 64d, 66, 68a to 68d, 70, 74a, 74b, 76a to 76n, and wirings R11 to R14, R21 to R24, RB. In addition to the interposer terminals 74a, 74b, 76a to 76n, other interposer terminals are also preferably provided on the lower surface of the element body 60. However, reference numerals are omitted from the interposer terminals other than the interposer terminals 74a, 74b, 76a to 76n.

The element body 60 preferably has a rectangular or substantially rectangular parallelepiped shape. Accordingly, the element body 60 includes an upper surface (one example of a top surface), a lower surface and side surfaces. The upper surface and the lower surface are parallel or substantially parallel to each other. The lower surface of the element body 60 defines a mounting surface which opposes the upper surface of the circuit board 12a in mounting the interposer 16 on the circuit board 12a. The side surfaces preferably include a front surface, a rear surface, a left surface, and a right surface, and connect the upper surface and the lower surface with each other. The element body 60 is a stack in which ceramic layers 62a to 62e are stacked in this order from the top to the bottom. The ceramic layers 62a to 62e are preferably layers having a rectangular shape as viewed from above. The ceramic layers 62a to 62e are preferably made of LTCC (low temperature co-fired ceramics), for example. However, a material used to form the ceramic layers 62a to 62e is not limited to LTCC.

As shown in FIG. 3, the interposer terminals 64a to 64d (one example of a first interposer terminal) are provided on the upper surface of the ceramic layer 62a (the upper surface of the element body 60), and are positioned in a region on the left half of the upper surface of the ceramic layer 62a. The interposer terminals 64a to 64d are preferably rectangular or substantially rectangular conductor layers. The interposer terminals 64a to 64d are arranged in this order from the rear side to the front side.

As shown in FIG. 3, the interposer terminal 66 (one example of the first interposer terminal) is provided on the upper surface of the ceramic layer 62a (the upper surface of the element body 60). The interposer terminal 66 is a conductor layer having a rectangular frame shape. The interposer terminal 66 surrounds the interposer terminals 64a to 64d as viewed from above. Accordingly, the interposer terminals 64a to 64d, 66 preferably have the same or substantially the same structure as the cable terminals 40a to 40d, 42.

As shown in FIG. 3, the interposer terminals 68a to 68d (one example of a second interposer terminal) are preferably provided on the upper surface of the ceramic layer 62a (the upper surface of the element body 60), and are positioned in a region on the right half of the upper surface of the ceramic layer 62a. The interposer terminals 68a to 68d are preferably defined by rectangular or substantially rectangular conductor layers. The interposer terminals 68a to 68d are arranged in this order from the rear side to the front side.

As shown in FIG. 3, the interposer terminal 70 (one example of the second interposer terminal) is provided on the upper surface of the ceramic layer 62a (the upper surface of the element body 60). The interposer terminal 70 is preferably a conductor layer having a rectangular or substantially rectangular frame shape. The interposer terminal 70 surrounds the interposer terminals 68a to 68d as viewed from above. Accordingly, the interposer terminals 68a to 68d, 70 have the same structure as cable terminals 50a to 50d, 52 (one example of a second cable terminal).

21 square-shaped interposer terminals and six rectangular interposer terminals are preferably provided on the lower surface of the ceramic layer 62e (the lower surface of the element body 60). The 21 square-shaped interposer terminals are preferably arranged in, for example, a 3-row by 7-column matrix. The interposer terminals 76a to 76g are arranged in the right-left direction on the rearmost row of the 21 square-shaped interposer terminals. The interposer terminal 76a to 76g are arranged in this order from the right side to the left side. The interposer terminals 76h to 76n are arranged in the right-left direction on the frontmost row of the 21 square-shaped interposer terminals. The interposer terminals 76h to 76n are arranged in this order from the right side to the left side.

Of the six rectangular interposer terminals, the interposer terminal 74a is provided in the vicinity of the right side of the ceramic layer 62e. The interposer terminal 74a extends in the front-rear direction along the right side of the ceramic layer 62e. Of the six rectangular interposer terminals, the interposer terminal 74b is provided in the vicinity of the left side of the ceramic layer 62e. The interposer terminal 74b extends in the front-rear direction along the left side of the ceramic layer 62e.

The wiring R11 (one example of a first wiring) electrically connects the interposer terminal 64a and the interposer terminal 76g with each other. As shown in FIG. 4, the wiring R11 is provided in the element body 60. The wiring R11 preferably includes via hole conductors v21, v22, and a wiring conductor 78f. The wiring conductor 78f is a conductor layer which is provided on the upper surface of the ceramic layer 62b. The via hole conductor v21 penetrates the ceramic layer 62a in the up-down direction. The via hole conductor v21 connects the interposer terminal 64a and the wiring conductor 78f with each other. The via hole conductor v22 penetrates the ceramic layers 62b to 62e in the up-down direction. The via hole conductor v22 connects the wiring conductor 78f and the interposer terminal 76g with each other.

The wiring R12 (one example of the first wiring) electrically connects the interposer terminal 66 and the interposer terminal 74b with each other. As shown in FIG. 4, the wiring R12 is provided in the element body 60. The wiring R12 preferably includes via hole conductors v23, v24 and a wiring conductor 78g. The wiring conductor 78g is a conductor layer which is provided on the upper surface of the ceramic layer 62c. The via hole conductor v23 penetrates the ceramic layers 62a, 62b in the up-down direction. The via hole conductor v23 connects the interposer terminal 66 and the wiring conductor 78g with each other. The via hole conductor v24 penetrates the ceramic layers 62c to 62e in the up-down direction. The via hole conductor v24 connects the wiring conductor 78g and the interposer terminal 74b with each other.

The wiring R13 (one example of the first wiring) electrically connects the interposer terminal 66 and the interposer terminal 76d with each other. As shown in FIG. 4, the wiring R13 is provided in the element body 60. The wiring R13 preferably includes via hole conductors v18 to v20, and wiring conductors 78d, 78e. The wiring conductor 78d is a conductor layer which is provided on the upper surface of the ceramic layer 62b. The wiring conductor 78e is a conductor layer which is provided on the upper surface of the ceramic layer 62c. The via hole conductor v18 penetrates the ceramic layer 62a in the up-down direction. The via hole conductor v18 connects the interposer terminal 66 and the wiring conductor 78d with each other. The via hole conductor v19 is a conductor which penetrates the ceramic layer 62b in the up-down direction. The via hole conductor v19 connects the wiring conductor 78d and the wiring conductor 78e with each other. The via hole conductor v20 penetrates the ceramic layers 62c to 62e in the up-down direction. The via hole conductor v20 connects the wiring conductor 78e and the interposer terminal 76d with each other.

The wiring R14 (one example of the first wiring) electrically connects the interposer terminal 66 and the interposer terminal 74b with each other. As shown in FIG. 5, the wiring R14 is provided in the element body 60. The wiring R14 preferably includes via hole conductors v29, v30, and a wiring conductor 78j. The wiring conductor 78j is a conductor layer which is provided on the upper surface of the ceramic layer 62c. The via hole conductor v29 penetrates the ceramic layers 62a, 62b in the up-down direction. The via hole conductor v29 connects the interposer terminal 66 and the wiring conductor 78j with each other. The via hole conductor v30 penetrates the ceramic layers 62c to 62e in the up-down direction. The via hole conductor v30 connects the wiring conductor 78j and the interposer terminal 74b with each other.

The wiring R21 (one example of a second wiring) electrically connects the interposer terminal 68a with the interposer terminals 76a, 76b. As shown in FIG. 4, the wiring R21 is provided in the element body 60. The wiring R21 preferably includes via hole conductors v13 to v15, and a wiring conductor 78b. The wiring conductor 78b is a conductor layer which is provided on the upper surface of the ceramic layer 62c. The via hole conductor v13 penetrates the ceramic layers 62a, 62b in the up-down direction. The via hole conductor v13 connects the interposer terminal 68a and the wiring conductor 78b with each other. The via hole conductors v14, v15 penetrate the ceramic layers 62c to 62e in the up-down direction. The via hole conductor v14 connects the wiring conductor 78b and the interposer terminal 76a with each other. The via hole conductor v15 connects the wiring conductor 78b and the interposer terminal 76b with each other.

The wiring R22 (one example of the second wiring) electrically connects the interposer terminal 70 and the interposer terminal 76c with each other. As shown in FIG. 4, the wiring R22 is provided in the element body 60. The wiring R22 preferably includes via hole conductors v16, v17 and a wiring conductor 78c. The wiring conductor 78c is a conductor layer which is provided on the upper surface of the ceramic layer 62b. The via hole conductor v16 penetrates the ceramic layer 62a in the up-down direction. The via hole conductor v16 connects the interposer terminal 70 and the wiring conductor 78c with each other. The via hole conductor v17 penetrates the ceramic layers 62b to 62e in the up-down direction. The via hole conductor v17 connects the wiring conductor 78c and the interposer terminal 76b with each other.

The wiring R23 (one example of the second wiring) electrically connects the interposer terminal 70 and the interposer terminal 74a with each other. As shown in FIG. 4, the wiring R23 is provided in the element body 60. The wiring R23 preferably includes via hole conductors v11, v12, and a wiring conductor 78a. The wiring conductor 78a is a conductor layer which is provided on the upper surface of the ceramic layer 62c. The via hole conductor v11 penetrates the ceramic layers 62a, 62b in the up-down direction. The via hole conductor v11 connects the interposer terminal 70 and the wiring conductor 78a with each other. The via hole conductor v12 penetrates the ceramic layers 62c to 62e in the up-down direction. The via hole conductor v12 connects the wiring conductor 78a and the interposer terminal 74a with each other.

The wiring R24 (one example of the second wiring) electrically connects the interposer terminal 70 and the interposer terminal 74a with each other. As shown in FIG. 5, the wiring R24 is provided in the element body 60. The wiring R24 preferably includes via hole conductors v25, v26, and a wiring conductor 78h. The wiring conductor 78h is a conductor layer which is provided on the upper surface of the ceramic layer 62c. The via hole conductor v25 penetrates the ceramic layers 62a, 62b in the up-down direction. The via hole conductor v25 connects the interposer terminal 70 and the wiring conductor 78h with each other. The via hole conductor v26 penetrates the ceramic layers 62c to 62e in the up-down direction. The via hole conductor v26 connects the wiring conductor 78h and the interposer terminal 74a with each other.

The bypass wiring RB electrically connects the interposer terminal 64d and the interposer terminal 68d with each other. As shown in FIG. 5, the bypass wiring RB is provided in the element body 60. The bypass wiring RB in the present preferred embodiment is provided at a position closer to the upper surface of the element body 60 than to the lower surface of the element body 60. The bypass wiring RB preferably includes via hole conductors v27, v28, and a wiring conductor 78i. The wiring conductor 78i is a conductor layer which is provided on the upper surface of the ceramic layer 62b. The via hole conductor v27 penetrates the ceramic layer 62a in the up-down direction. The via hole conductor v27 connects the interposer terminal 68d and the wiring conductor 78i with each other. The via hole conductor v28 penetrates the ceramic layer 62a in the up-down direction. The via hole conductor v28 connects the interposer terminal 64d and the wiring conductor 78i with each other.

The wiring conductors 78a to 78j and the via hole conductors v11 to v30 are preferably made of, for example, a metal material which contains Ag, Cu and the like as a main component, and which has small resistivity. Further, the interposer terminals 64a to 64d, 66, 68a to 68d, 70, 74a, 74b, 76a to 76n are preferably formed by applying Ni plating and Sn plating to a base made of a metal material which contains Ag, Cu and the like as a main component. Ni plating and Au plating, Ni plating and Cu plating, or Ni plating and Ag plating may be applied, instead of applying Ni plating and Sn plating.

The interposer 16 having the above-described configuration is mounted on the upper surface of the circuit board 12a with solder. First, the internal structure of the circuit board 12a will be described with reference to FIG. 4 and FIG. 5.

As shown in FIG. 4 and FIG. 5, the circuit board 12a preferably includes a board body 90, circuit board terminals 92a, 92b, 94a to 94n, a ground conductor 96 (one example of a second ground conductor), and via hole conductors v40 to v47. The board body 90 is preferably a multilayer board, for example. The ground conductor 96 is a conductor layer which is provided in the board body 90. The ground conductor 96 is maintained at the ground potential. The circuit board terminals 92a, 92b, 94a to 94n are provided on the upper surface of the circuit board 12a. The circuit board terminals 92a, 92b, 94a to 94n respectively correspond to the interposer terminals 74a, 74b, 76a to 76n. The via hole conductors v40 to v47 are provided in the board body 90, and respectively connect the circuit board terminals 92a, 94d, 94c, 92b, 92a, 94j, 94k, 92b with the ground conductor 96.

The circuit board 12a also preferably includes a circuit which is defined by wiring conductors and via hole conductors not shown in the drawing. This circuit is connected to the circuit board terminals 94a, 94b, 94e to 94i, 94m, 94n.

The interposer terminals 74a, 74b, 76a to 76n are respectively connected to the circuit board terminals 92a, 92b, 94a to 94n through solder.

The flat cables 14a, 14b are connected to the upper surface of the interposer 16. To be more specific, the interposer terminals 64a to 64d, 66 are respectively connected to the cable terminals 40a to 40d, 42 through solder (one example of a conductive bonding member). Further, the interposer terminals 68a to 68d, 70 are respectively connected to the cable terminals 50a to 50d, 52 through solder (one example of the conductive bonding member).

The circuit board 12a, the interposer 16, and the flat cables 14a, 14b are connected with each other as described above and thus, the wirings R11 to R14 electrically connect the flat cable 14a and the circuit board 12a with each other. To be more specific, the wiring R11 connects the interposer terminal 64a and the interposer terminal 76g with each other. The interposer terminal 64a is connected to the cable terminal 40a which is electrically connected to the signal line 34a. Further, the interposer terminal 76g is connected to the circuit board terminal 94g which is connected to the circuit (not shown in the drawing) of the circuit board 12a. Accordingly, the wiring R11 electrically connects the signal line 34a of the flat cable 14a and the circuit (not shown in the drawing) of the circuit board 12a with each other.

Further, the wirings R12, R13, R14 electrically connect the flat cable 14a and the circuit board 12a with each other. To be more specific, the wirings R12, R14 connect the interposer terminal 66 and the interposer terminal 74b with each other, and the wiring R13 connects the interposer terminal 66 and the interposer terminal 76d with each other. The interposer terminal 66 is preferably connected to the cable terminal 42 which is electrically connected to the ground conductors 36, 38. Further, the interposer terminals 76d, 74b are respectively connected to the circuit board terminals 94d, 92b which are connected to the ground conductor 96. Accordingly, the wirings R12, R13, R14 electrically connect the ground conductors 36, 38 of the flat cable 14a with the ground conductor 96 of the circuit board 12a.

The interposer 16 may also include wirings which electrically connect the flat cable 14a and the circuit board 12a with each other in addition to the wirings R11 to R14.

The wiring R21 electrically connects the flat cable 14b and the circuit board 12a with each other. To be more specific, the wiring R21 electrically connects signal lines (not shown in the drawing) of the flat cable 14b and the circuit (not shown in the drawing) of the circuit board 12a with each other. The wiring R21 connects the interposer terminal 68a with the interposer terminals 76a, 76b. The interposer terminal 68a is connected to the cable terminal 50a which is electrically connected to the signal lines of the flat cable 14b. Further, the interposer terminals 76a, 76b are connected to the circuit board terminals 94a, 94b which are connected to the circuit of the circuit board 12a. Accordingly, the wiring R21 electrically connects the signal lines of the flat cable 14b and the circuit of the circuit board 12a with each other.

The wirings R22, R23, R24 electrically connect the flat cable 14b and the circuit board 12a with each other. To be more specific, the wiring R22 connects the interposer terminal 70 and the interposer terminal 76c with each other, and the wirings R23, R24 connect the interposer terminal 70 and the interposer terminal 74a with each other. The interposer terminal 70 is connected to the cable terminal 52 which is connected to the ground conductors (not shown in the drawing) of the flat cable 14b. Further, the interposer terminals 76c, 74a are respectively connected to the circuit board terminals 94c, 92a which are connected to the ground conductor 96. Accordingly, the wirings R22, R23, R24 electrically connect the ground conductors of the flat cable 14b and the ground conductor 96 of the circuit board 12a with each other.

The interposer 16 may also include wirings which electrically connect the flat cable 14b and the circuit board 12a with each other in addition to the wirings R21 to R24.

The bypass wiring RB electrically connects the flat cable 14a and the flat cable 14b with each other. To be more specific, the bypass wiring RB connects the interposer terminal 64d and the interposer terminal 68d with each other. The interposer terminal 64d is connected to the cable terminal 40d which is connected to the signal line 34d of the flat cable 14a. Further, the interposer terminal 68d is connected to the cable terminal 50d which is connected to the signal line (not shown in the drawing) of the flat cable 14b. Accordingly, the bypass wiring RB electrically connects the signal line 34d of the flat cable 14a and the signal lines of the flat cable 14b with each other.

The interposer 18a electrically connects the flat cable 14a and the circuit board 12b with each other. The interposer 18b electrically connects the flat cable 14b and the circuit board 12c with each other. Accordingly, the circuit board 12a and the circuit board 12b are electrically connected with each other through the flat cable 14a, the interposer 18a, and the wirings R11 to R14 of the interposer 16. The circuit board 12a and the circuit board 12c are electrically connected with each other through the flat cable 14b, the interposer 18b, and the wirings R21 to R24 of the interposer 16. Further, the circuit board 12b and the circuit board 12c are electrically connected with each other through the flat cables 14a, 14b, the interposers 18a, 18b, and the bypass wiring RB of the interposer 16.

Figure 6:
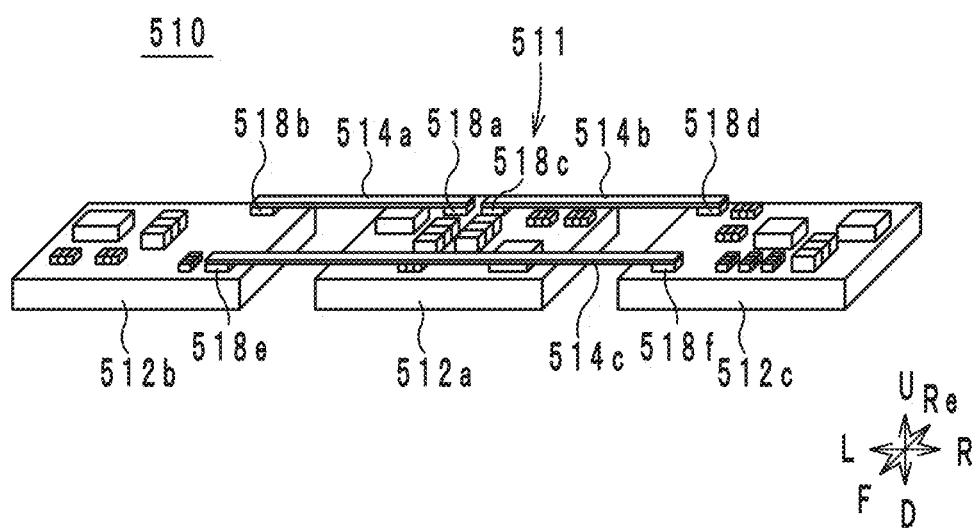
FIG. 6 is a perspective view of an electronic device 510 according to a Comparative Example.

According to the interposer 16, the circuit module 11, and the electronic device 10 having the above-described configuration, as described below, it is possible to reduce the area of a region that connects the circuit boards 12a to 12c with the flat cables 14a, 14b. FIG. 6 is a perspective view of electronic device 510 according to a Comparative Example.

The electronic device 510 includes a circuit module 511. The circuit module 511 preferably includes circuit boards 512a to 512c, flat cables 514a to 514c, and guide members 518a to 518f. The circuit boards 512a to 512c preferably have the same or substantially the same structures as the circuit boards 12a to 12c. The guide members 518a to 518f preferably have, for example, the same or a similar structure as the guide member described in Japanese Patent No. 5842850. The guide members 518a, 518c are mounted on the upper surface of the circuit board 512a. The guide members 518b, 518e are mounted on the upper surface of the circuit board 512b. The guide members 518d, 518f are mounted on the upper surface of the circuit board 512c.

The right end of the flat cable 514a is connected to the guide member 518a. The left end of the flat cable 514a is connected to the guide member 518b. Accordingly, the circuit board 512a and the circuit board 512b are electrically connected with each other through the flat cable 514a.

The left end of the flat cable 514b is connected to the guide member 518c. The right end of the flat cable 514b is connected to the guide member 518d. Accordingly, the circuit board 512a and the circuit board 512c are electrically connected with each other through the flat cable 514b.

The left end of the flat cable 514c is connected to the guide member 518e. The right end of the flat cable 514c is connected to the guide member 518f. Accordingly, the circuit board 512b and the circuit board 512c are electrically connected with each other through the flat cable 514c.

As described above, in the circuit module 511 and the electronic device 510 according to the Comparative Example, six guide members 518a to 518f are necessary in order to connect the circuit boards 512a to 512c with each other. Accordingly, it is necessary for the circuit boards 512a to 512c to have mounting areas of six guide members 518a to 518f.

In view of the above, in the circuit module 11 and the electronic device 10, the interposer 16 includes the bypass wiring RB which electrically connects the flat cable 14a and the flat cable 14b with each other. With such a configuration, it is possible to electrically connect the circuit board 12b and the circuit board 12c with each other without using a flat cable in addition to the flat cables 14a, 14b. In other words, the circuit board 12b and the circuit board 12c are electrically connected with each other through the flat cables 14a, 14b, the interposers 18a, 18b, and the bypass wiring RB of the interposer 16. Further, the circuit board 12a and the circuit board 12b are electrically connected with each other through the flat cable 14a, the interposer 18a, and the wirings R11 to R14 of the interposer 16. The circuit board 12a and the circuit board 12c are electrically connected with each other through the flat cable 14b, the interposer 18b, and the wirings R21 to R24 of the interposer 16. As a result, three interposers 16, 18a, 18b are sufficient for connecting the circuit boards 12a to 12c with each other. As a result, it is possible to reduce the area of a region that connects the circuit boards 12a to 12c with the flat cables 14a, 14b.

In the circuit module 511 and the electronic device 510, three flat cables 514a to 514c are used to connect the circuit boards 512a to 512c with each other. On the other hand, in the circuit module 11 and the electronic device 10, two flat cables 14a, 14b are sufficient to connect the circuit boards 12a to 12c with each other. Accordingly, in the interposer 16 and the electronic device 10, the number of flat cables is able to be reduced.

In the interposer 16, the circuit module 11, and the electronic device 10, it is also possible to reduce an insertion loss which may be generated between the circuit board 12b and the circuit board 12c. FIG. 7 is a cross-sectional view of an area in the vicinity of interposers 616a, 616b of electronic device 610 according to a Comparative Example.

In a circuit module 611 and the electronic device 610, a circuit board 612b (not shown in the drawing, and corresponding to the circuit board 12b) and a circuit board 612c (not shown in the drawing, and corresponding to the circuit board 12c) are electrically connected with each other through a circuit board 612a, flat cables 614a, 614b, and the interposers 616a, 616b. In this example, two interposers 616a, 616b are separated components. Accordingly, a bypass wiring RB passes through the interposer 616a, the circuit board 612a, and the interposer 616b. Therefore, it is necessary for the bypass wiring RB to extend from the upper surface to the lower surface of each of the interposers 616a, 616b. For this reason, the bypass wiring RB has a large length and thus, an insertion loss which may be generated between the circuit board 612b and the circuit board 612c increases.

On the other hand, in the interposer 16, the circuit module 11, and the electronic device 10, the bypass wiring RB is provided to the interposer 16, but is not provided to the circuit board 12a. Accordingly, the bypass wiring RB in the interposer 16, the circuit module 11, and the electronic device 10 is shorter than the bypass wiring RB in the circuit module 611 and the electronic device 610. As a result, in the interposer 16, the circuit module 11, and the electronic device 10, it is possible to reduce an insertion loss which may be generated between the circuit board 12b and the circuit board 12c compared with the circuit module 611 and the electronic device 610.

Particularly, in the interposer 16, the circuit module 11, and the electronic device 10, the bypass wiring RB is provided at a position close to the upper surface of the element body 60, instead of being provided at a position close to the lower surface of the element body 60 and thus, the length of the via hole conductors v27, v28 is further reduced. As a result, the length of the bypass wiring RB is further reduced and thus, it is possible to further reduce an insertion loss which may be generated between the circuit board 12b and the circuit board 12c.

Figure 8:
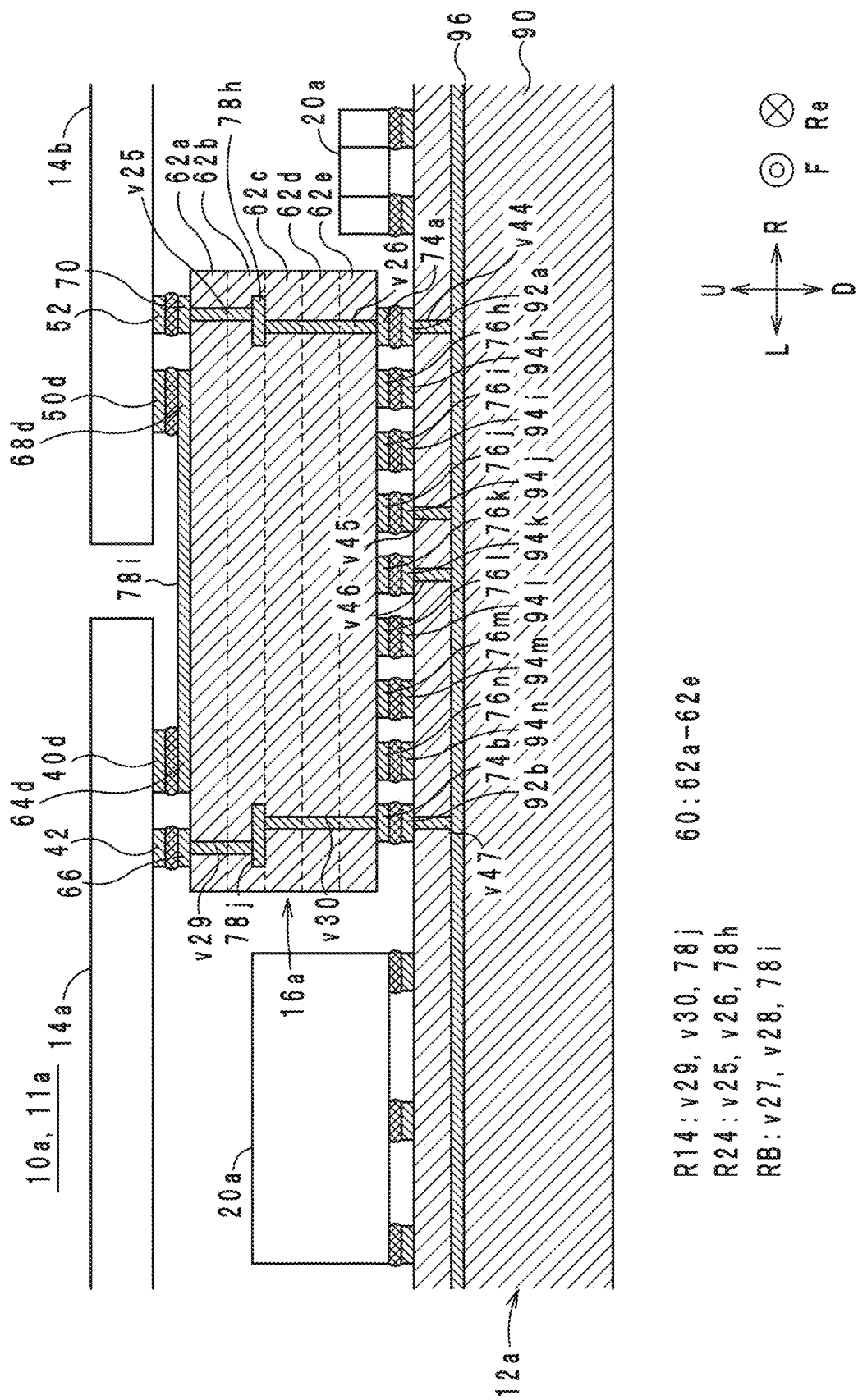
FIG. 8 is a cross-sectional view of an electronic device 10a which includes an interposer 16a according to a preferred embodiment of the present invention.

Hereinafter, an interposer 16a according to a first modification of a preferred embodiment of the present invention will be described with reference to a drawing. FIG. 8 is a cross-sectional view of electronic device 10a which includes the interposer 16a. FIG. 8 is a cross-sectional view taken at the same position as the cross-sectional view in FIG. 5.

The interposer 16a preferably differs from the interposer 16 in terms of the structure of a bypass wiring RB. In the interposer 16a, the bypass wiring RB is provided on the surface of an element body 60. To be more specific, in the interposer 16a, the bypass wiring RB includes a wiring conductor 78i, but does not include via hole conductors v27, v28. The wiring conductor 78i is provided on the surface of a ceramic layer 62a. The wiring conductor 78i connects an interposer terminal 64d and the interposer terminal 68d with each other. Other structures of the interposer 16a are the same or substantially the same as corresponding structures of the interposer 16 and thus, the description of other structures is omitted.

According to the interposer 16a, a circuit module 11a, and the electronic device 10a having the above-described configuration, for the same reason as the interposer 16, the circuit module 11, and the electronic device 10, it is possible to reduce the area of a region that connects circuit boards 12a to 12c with flat cables 14a, 14b. Further, according to the interposer 16a, the circuit module 11a, and the electronic device 10a, the number of flat cables is able to be reduced for the same reason as the interposer 16, the circuit module 11, and the electronic device 10.

Further, in the interposer 16a, the circuit module 11a, and the electronic device 10a, it is possible to further reduce an insertion loss which may be generated between the circuit board 12b and the circuit board 12c. To be more specific, the bypass wiring RB of the interposer 16a preferably does not include the via hole conductors v27, v28. Accordingly, the bypass wiring RB of the interposer 16a is shorter than the bypass wiring RB of the interposer 16 by the lengths of the via hole conductors v27, v28. Therefore, in the interposer 16a, the circuit module 11a, and the electronic device 10a, it is possible to further reduce an insertion loss which may be generated between the circuit board 12b and the circuit board 12c.

Figure 9:
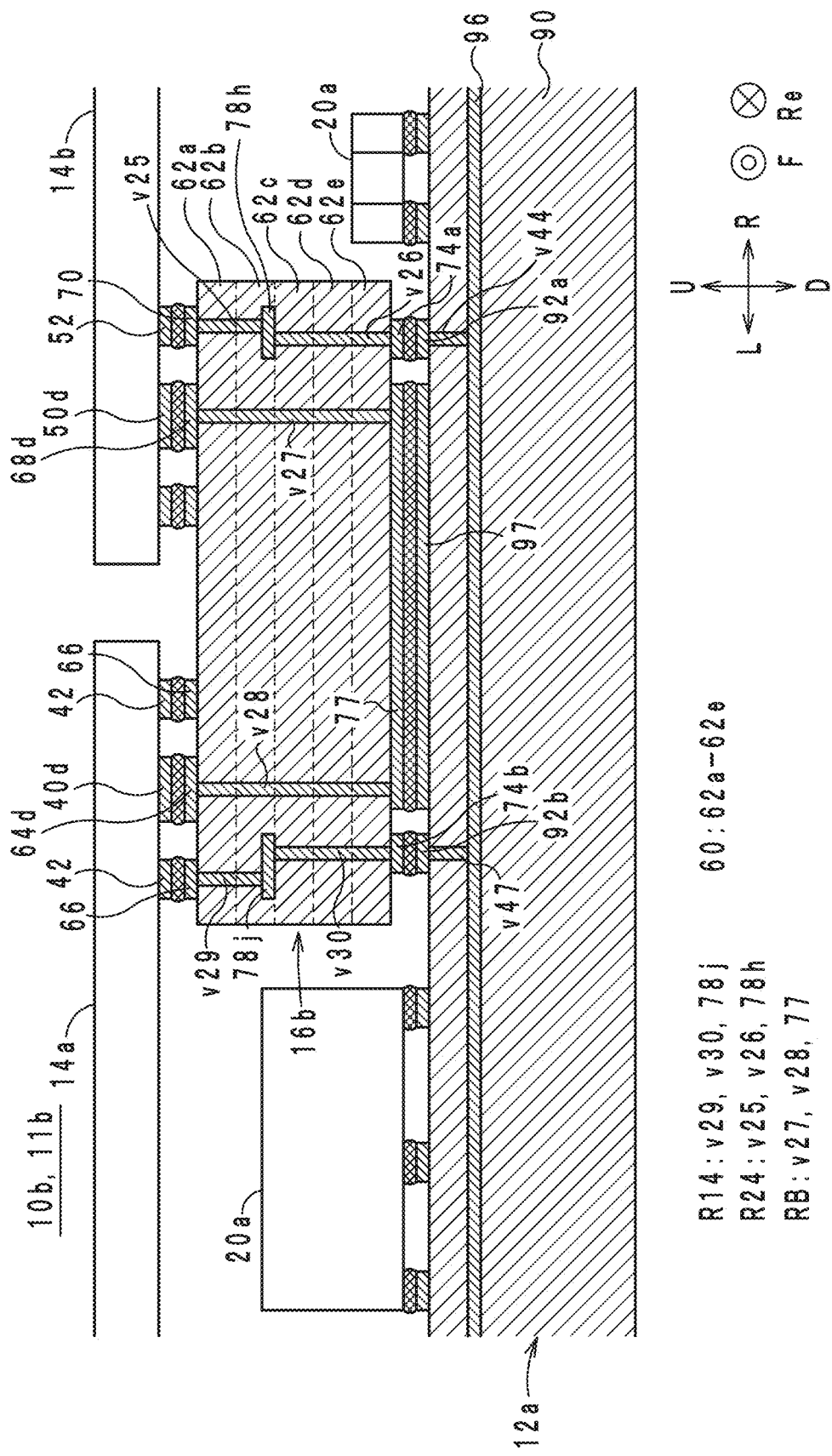
FIG. 9 is a cross-sectional view of an electronic device 10b which includes an interposer 16b according to a preferred embodiment of the present invention.

Hereinafter, an interposer 16b according to a second modification of a preferred embodiment of the present invention will be described with reference to a drawing. FIG. 9 is a cross-sectional view of electronic device 10b which includes the interposer 16b. FIG. 9 is a cross-sectional view taken at the same position as the cross-sectional view in FIG. 5.

The interposer 16b preferably differs from the interposer 16 in terms of the structure of a bypass wiring RB. In the interposer 16b, the bypass wiring RB is provided on the surface of and in the element body 60. To be more specific, in the interposer 16b, the bypass wiring RB includes an interposer terminal 77 and via hole conductors v27, v28. The interposer terminal 77 is provided on the lower surface of a ceramic layer 62e. The interposer terminal 77 is connected to a circuit board terminal 97 of a circuit board 12a through solder. Further, interposer terminals 76h to 76n are not provided to the interposer 16b.

The via hole conductors v27, v28 penetrate ceramic layers 62a to 62e in the up-down direction. The via hole conductor v27 connects an interposer terminal 68d and the interposer terminal with each other. The via hole conductor v28 connects an interposer terminal 64d and the interposer terminal 77 with each other. Other structures of the interposer 16b are preferably the same or substantially the same as the corresponding structures of the interposer 16 and thus, the description of other structures is omitted.

According to the interposer 16b, a circuit module 11b, and the electronic device 10b having the above-described configuration, for the same reason as the interposer 16, the circuit module 11, and the electronic device 10, it is possible to reduce the area of a region that connects the circuit boards 12a to 12c with the flat cables 14a, 14b. Further, according to the interposer 16b, the circuit module 11b, and the electronic device 10b, the number of flat cables is able to be reduced for the same reason as the interposer 16, the circuit module 11, and the electronic device 10. Further, the bypass wiring RB preferably includes an intermediate portion at which the interposer terminal and the circuit board terminal 97 are connected with each other through solder, and this intermediate portion has a low resistance value. Accordingly, in the interposer 16b, the circuit module 11b, and the electronic device 10b, although the bypass wiring RB is routed to the lower surface of the interposer 16b, it is possible to prevent an increase in an insertion loss which may be generated between the circuit board 12b and the circuit board 12c.

Figure 10:
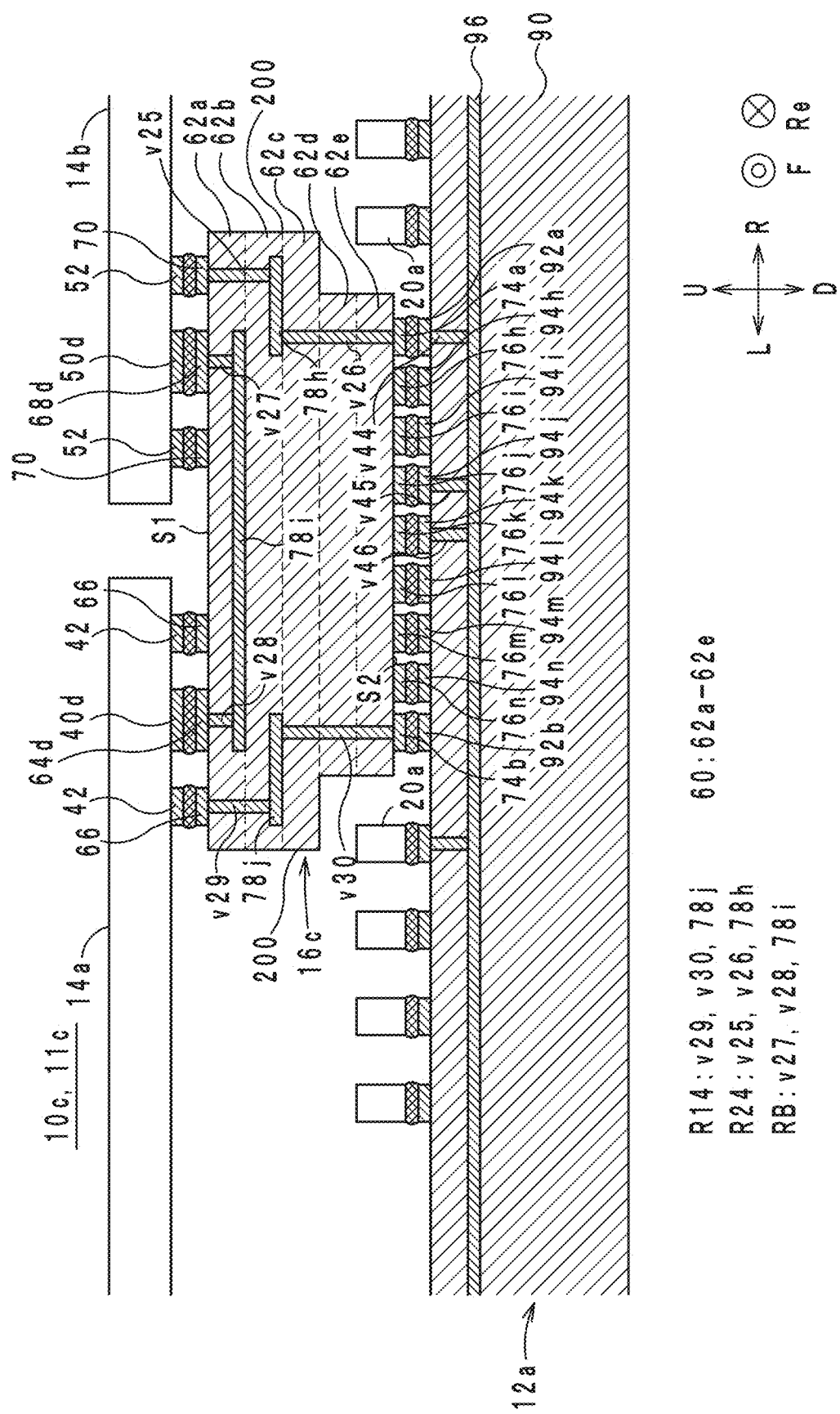
FIG. 10 is a cross-sectional view taken at the same position as the cross-sectional view in FIG. 5.

Hereinafter, an interposer 16c according to a third modification of a preferred embodiment of the present invention will be described with reference to drawings. FIG. 10 is a cross-sectional view of electronic device 10c which includes the interposer 16c. FIG. 10 is a cross-sectional view taken at the same position as the cross-sectional view in FIG. 5. FIG. 11 is a view of the electronic device 10c as viewed from above.

The interposer 16c preferably differs from the interposer 16 in terms of the shape of an element body 60. To be more specific, at least a portion of an upper surface S1 of the element body 60 projects from a lower surface S2 of the element body 60. In the present preferred embodiment, the lower surface S2 falls within the range of the upper surface S1. Hereinafter, a portion of the upper surface S1 which projects from the lower surface S2 is referred to as an "eaves portion 200". The eaves portion 200 overlaps with at least a portion of an electronic component 20a as viewed from above. Other structures of the interposer 16c are the same or substantially the same as the corresponding structures of the interposer 16 and thus, the description of other structures is omitted.

According to the interposer 16c, a circuit module 11c, and the electronic device 10c having the above-described configuration, for the same reason as the interposer 16, the circuit module 11, and the electronic device 10, it is possible to reduce the area of a region that connects circuit boards 12a to 12c with flat cables 14a, 14b. Further, according to the interposer 16c, the circuit module 11c, and the electronic device 10c, the number of flat cables is able to be reduced for the same reason as the interposer 16, the circuit module 11, and the electronic device 10. Further, in the interposer 16c, the circuit module 11c, and the electronic device 10c, for the same reason as the interposer 16, the circuit module 11, and the electronic device 10, it is possible to further reduce an insertion loss which may be generated between the circuit board 12b and the circuit board 12c.

Further, according to the interposer 16c, the circuit module 11c, and the electronic device 10c, a larger number of electronic components 20a is able to be mounted, or the electronic component 20a having a larger size is able to be mounted. To be more specific, in the interposer 16c, at least a portion of the upper surface S1 of the element body 60 projects from the lower surface S2 of the element body 60. With such a configuration, the eaves portions 200 are defined on the element body 60. The electronic components 20a are able to be disposed below the eaves portions 200. In other words, a region is increased on which the electronic components 20a are able to be mounted. As a result, according to the interposer 16c, the circuit module 11c, and the electronic device 10c, a larger number of the electronic components 20a is able to be mounted, or the electronic component 20a having a larger size is able to be mounted.

In the interposer 16c, the circuit module 11c, and the electronic device 10c, the size of an external terminal which is provided on the upper surface of the circuit board 12a may be increased instead of increasing the number of the electronic components 20a.

The eaves portions 200 may overlap with the entire or substantially the entire electronic components 20a as viewed from above.

Figure 12:
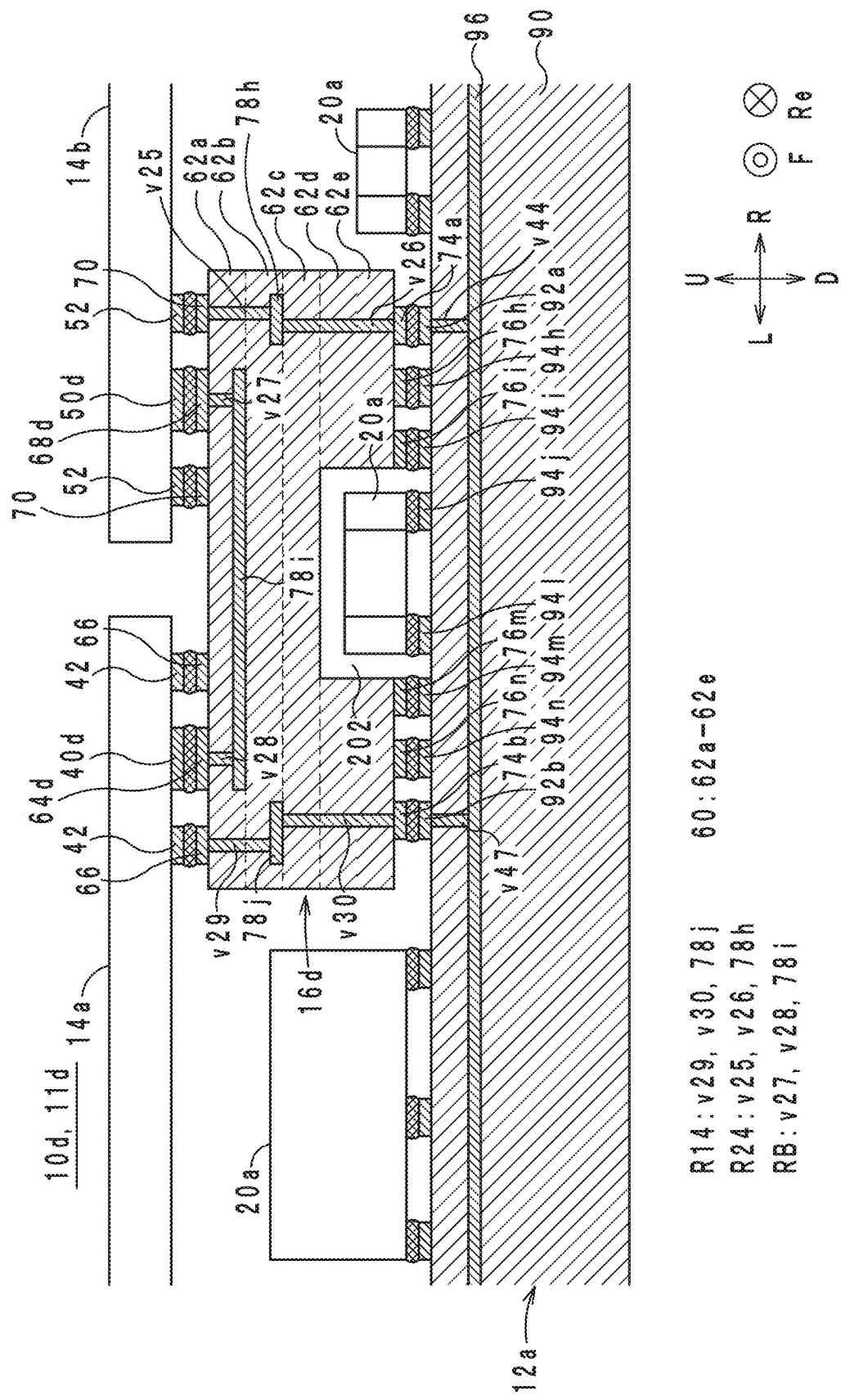
FIG. 12 is a cross-sectional view of an electronic device 10d which includes an interposer 16d according to a preferred embodiment of the present invention.

Hereinafter, an interposer 16d according to a fourth modification of a preferred embodiment of the present invention will be described with reference to a drawing. FIG. 12 is a cross-sectional view of electronic device 10d which includes the interposer 16d. FIG. 12 is a cross-sectional view taken at the same position as the cross-sectional view in FIG. 5.

The interposer 16d preferably differs from the interposer 16 in terms of the shape of an element body 60. To be more specific, a recessed portion 202 is provided on the lower surface of the element body 60. The recessed portion 202 is provided such that the center of the lower surface of the element body 60 is recessed upward. Further, the recessed portion 202 overlaps with at least a portion of an electronic component 20a as viewed from above (one example of the normal direction of the upper surface of a circuit board 12a). In the present preferred embodiment of the present invention, the recessed portion 202 overlaps with the entire or substantially the entire electronic components 20a as viewed from above (one example of the normal direction of the upper surface of the circuit board 12a). Accordingly, the electronic components 20a are positioned in the recessed portion 202.

According to the interposer 16d, a circuit module 11d, and the electronic device 10d having the above-described configuration, for the same reason as the interposer 16, the circuit module 11, and the electronic device 10, it is possible to reduce the area of a region that connects the circuit boards 12a to 12c with flat cables 14a, 14b. Further, according to the interposer 16d, the circuit module 11d, and the electronic device 10d, the number of flat cables is able to be reduced for the same reason as the interposer 16, the circuit module 11, and the electronic device 10. Further, in the interposer 16d, the circuit module 11d, and the electronic device 10d, for the same reason as the interposer 16, the circuit module 11, and the electronic device 10, it is possible to further reduce an insertion loss which may be generated between the circuit board 12b and the circuit board 12c.

Further, according to the interposer 16d, the circuit module 11d, and the electronic device 10d, a larger number of the electronic components 20a is able to be mounted. To be more specific, in the interposer 16d, the electronic components 20a are able to also be mounted on a portion of the circuit board 12a which opposes the recessed portion 202. As a result, according to the interposer 16d, the circuit module 11d, and the electronic device 10d, a larger number of the electronic components 20a is able to be mounted.

Figure 13:
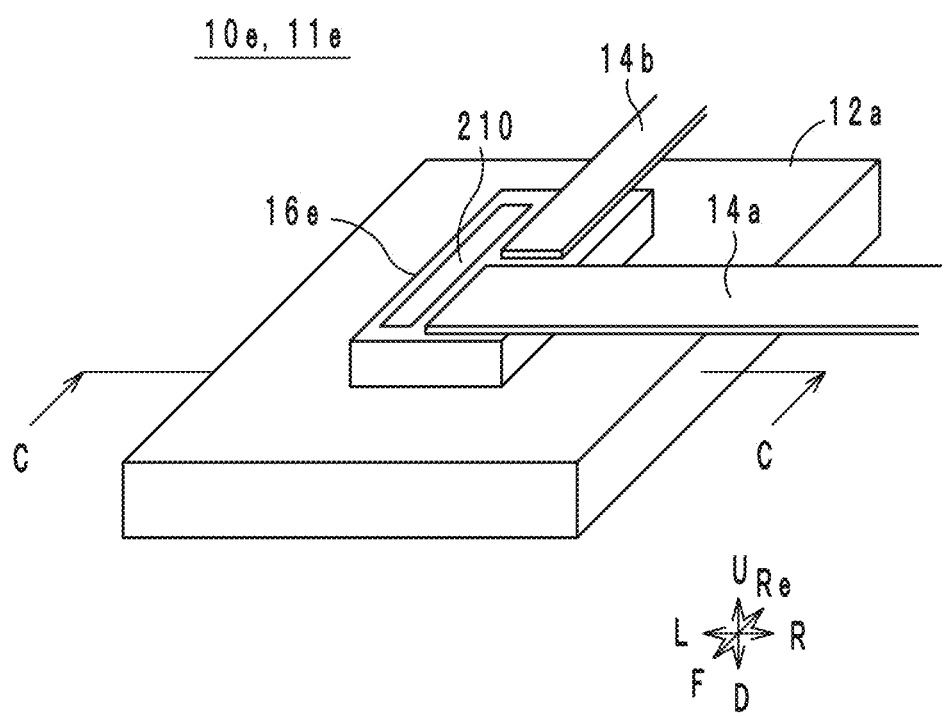
FIG. 13 is a perspective view of an electronic device 10e which includes an interposer 16e according to a preferred embodiment of the present invention.
Figure 14:
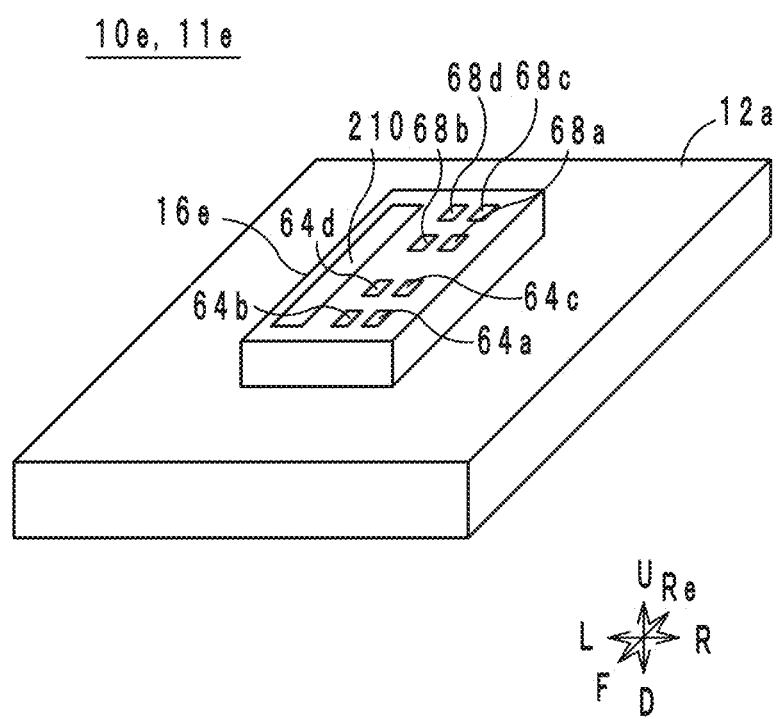
FIG. 14 is a perspective view of the electronic device 10e which includes the interposer 16e according to a preferred embodiment of the present invention.

Hereinafter, an interposer 16e according to a fifth modification of a preferred embodiment of the present invention will be described with reference to drawings. FIG. 13 and FIG. 14 are perspective views of electronic device 10e which includes the interposer 16e. FIG. 14 shows a state in which flat cables 14a, 14b are removed. FIG. 15 and FIG. 16 are cross-sectional views taken along a line C-C in FIG. 13.

The electronic device 10e includes a circuit module 11e. As shown in FIG. 13, the circuit module 11e preferably includes a circuit board 12a, the interposer 16e, and the flat cables 14a, 14b. In the same or similar manner as the circuit module 11, the circuit module 11e also includes circuit boards 12b, 12c. However, the circuit boards 12b, 12c are omitted in FIG. 13.

As shown in FIG. 14 to FIG. 16, the interposer 16e preferably includes an element body 60, interposer terminals 64a to 64d, 68a to 68d, 76a to 76c, a heating terminal 210, heating conductors 212a, 212b, via hole conductors v110, v111, and wirings R15, R16. In addition to the interposer terminals 76a to 76c, other interposer terminals are also provided on the lower surface of the element body 60. However, the interposer terminals other than the interposer terminals 76a to 76c are omitted.

The element body 60 preferably has a rectangular or substantially rectangular parallelepiped shape. The element body 60 is a stack in which ceramic layers 62a to 62d are stacked in this order from the top to the bottom. The ceramic layers 62a to 62d are layers preferably having a rectangular or substantially rectangular shape as viewed from above. The ceramic layers 62a to 62d are preferably made of LTCC (low temperature co-fired ceramics), for example.

As shown in FIG. 14, the interposer terminals 64a to 64d are preferably provided on the upper surface of the ceramic layer 62a (the upper surface of the element body 60), and are positioned in a region on the front half of the upper surface of the ceramic layer 62a. The interposer terminals 64a to 64d are preferably rectangular or substantially rectangular conductor layers. The interposer terminals 64a to 64d are arranged in a 2-row by 2-column matrix.

As shown in FIG. 14, the interposer terminals 68a to 68d are provided on the upper surface of the ceramic layer 62a (the upper surface of the element body 60), and are positioned in a region on the rear half of the upper surface of the ceramic layer 62a. The interposer terminals 68a to 68d are preferably rectangular or substantially rectangular conductor layers. The interposer terminals 68a to 68d are arranged in a 2-row by 2-column matrix.

As shown in FIG. 15 and FIG. 16, the interposer terminals 76a to 76c are provided on the lower surface of the ceramic layer 62d (the lower surface of the element body 60). The interposer terminals 76a to 76c are preferably rectangular or substantially rectangular conductor layers. The interposer terminals 76a to 76c are arranged in this order from the right side to the left side.

The wiring R15 (one example of a first wiring) electrically connects the interposer terminal 64a and the interposer terminal 76a with each other. As shown in FIG. 15 and FIG. 16, the wiring R15 is provided in the element body 60. The wiring R15 includes a via hole conductor v101. The via hole conductor v101 penetrates the ceramic layers 62a to 62d in the up-down direction. The via hole conductor v101 connects the interposer terminal 64a and the interposer terminal 76a with each other.

The wiring R16 (one example of the first wiring) electrically connects the interposer terminal 64b and the interposer terminal 76b with each other. As shown in FIG. 15 and FIG. 16, the wiring R16 is provided in the element body 60. The wiring R16 preferably includes via hole conductors v102, v103 and a wiring conductor 78k. The wiring conductor 78k is a conductor layer which is provided on the upper surface of the ceramic layer 62c. The via hole conductor v102 penetrates the ceramic layers 62a, 62b in the up-down direction. The via hole conductor v102 connects the interposer terminal 64b and the wiring conductor 78k with each other. The via hole conductor v103 penetrates the ceramic layers 62c, 62d in the up-down direction. The via hole conductor v103 connects the wiring conductor 78k and the interposer terminal 76b with each other.

Although not shown in the drawing, the interposer 16e preferably includes wirings R25, R26 and a bypass wiring RB. In the same or similar manner as the wirings R21 to R24 of the interposer 16, the wirings R25, R26 electrically connect the flat cable 14b and the circuit board 12a with each other.

In the same or similar manner as the bypass wiring RB of the interposer 16, the bypass wiring RB of the interposer 16e connects the flat cable 14a and the flat cable 14b with each other. Accordingly, the bypass wiring RB of the interposer 16e connects the interposer terminal 64d and the interposer terminal 68b with each other. In the same or similar manner as the bypass wiring RB of the interposer 16, the bypass wiring RB of the interposer 16e includes via hole conductors and wiring conductors not shown in the drawing.

The heating terminal 210 is provided on the surface other than the lower surface of the element body 60. In the present preferred embodiment, as shown in FIG. 13 and FIG. 14, the heating terminal 210 is provided on the upper surface of the ceramic layer 62a (the upper surface of the element body 60), and is positioned in a region on the left half of the upper surface of the ceramic layer 62a. The heating terminal 210 is preferably a rectangular or substantially rectangular conductor layer which extends in the front-rear direction. The heating terminal 210 is preferably not used for the connection between the flat cables 14a, 14b and the interposer 16e.

The heating conductor 212a is a conductor layer which is provided on the upper surface of the ceramic layer 62c. The heating conductor 212a is provided in the vicinity of the wiring conductor 78k. The heating conductor 212b (one example of a first heating conductor) is a conductor layer which is provided on the upper surface of the ceramic layer 62d. In FIG. 15 and FIG. 16, the heating conductor 212b is preferably divided into three members. This is to allow the heating conductor 212b to avoid the via hole conductors v101, v103. Accordingly, the heating conductor 212b is one continuous body in cross section taken at a position different from the position of FIG. 15 and FIG. 16 in the front-rear direction. The heating conductor 212b is provided in the vicinity of the via hole conductors v101, v103. The heating conductor 212b is provided in the element body 60 at a position closer to the lower surface than to the upper surface of the element body 60. Further, the heating conductor 212b opposes the interposer terminals 76a to 76c in the up-down direction.

The via hole conductor v110 is a conductor which penetrates the ceramic layers 62a, 62b in the up-down direction. The via hole conductor v110 connects the heating terminal 210 and the heating conductor 212a with each other. The via hole conductor v111 penetrates the ceramic layer 62c in the up-down direction. The via hole conductor v111 connects the heating conductor 212a and the heating conductor 212b with each other. With such a configuration, the heating conductor 212b is electrically connected with the heating terminal 210.

The wiring conductor 78k, the heating conductors 212a, 212b, and the via hole conductors v101 to v103, v110, v111 are preferably made, for example, of a metal material which contains Ag, Cu and the like as a main component, and which has small resistivity. Further, the interposer terminals 64a to 64d, 68a to 68d, 76a to 76c are preferably formed by applying Ni plating and Sn plating to a base made of a metal material which contains Ag, Cu and the like as a main component, for example. Ni plating and Au plating, Ni plating and Cu plating, or Ni plating and Ag plating may be applied, instead of applying Ni plating and Sn plating.

The interposer 16e having the above-described configuration is mounted on the upper surface of the circuit board 12a with solder. First, the structure of the circuit board 12a will be described with reference to FIG. 15 and FIG. 16.

As shown in FIG. 15 and FIG. 16, the circuit board 12a preferably includes a board body 90, and circuit board terminals 94a to 94c. The board body 90 is preferably a multilayer board, for example. The circuit board terminals 94a to 94c are provided on the upper surface of the circuit board 12a. The circuit board terminals 94a to 94c respectively correspond to the interposer terminals 76a to 76c. The interposer terminals 76a to 76c are respectively connected to the circuit board terminals 94a to 94c through solder.

The flat cables 14a, 14b are connected to the upper surface of the interposer 16. To be more specific, the interposer terminals 64a to 64d are respectively connected to cable terminals 40a to 40d (cable terminals 40c, 40d being not shown in the drawing) through solder. Further, the interposer terminals 68a to 68d are respectively connected to cable terminals (not shown in the drawing) of the flat cable 14b through solder.

The circuit board 12a, the interposer 16, and the flat cables 14a, 14b are connected with each other as described above and thus, the wirings R15, R16 electrically connect the flat cable 14a and the circuit board 12a with each other. The wirings R25, R26 (not shown in the drawing) electrically connect the flat cable 14b and the circuit board 12a with each other. Further, the bypass wiring RB (not shown in the drawing) electrically connects the flat cable 14a and the flat cable 14b with each other.

According to the interposer 16e, the circuit module 11e, and the electronic device 10e having the above-described configuration, for the same or similar reason as the interposer 16, the circuit module 11, and the electronic device 10, it is possible to reduce the area of a region that connects the circuit boards 12a to 12c with the flat cables 14a, 14b. Further, according to the interposer 16e, the circuit module 11e, and the electronic device 10e, the number of flat cables is able to be reduced for the same or similar reason as the interposer 16, the circuit module 11, and the electronic device 10. In the interposer 16e, the circuit module 11e, and the electronic device 10e, for the same or similar reason as the interposer 16, the circuit module 11, and the electronic device 10, it is also possible to further reduce an insertion loss which may be generated between the circuit board 12b and the circuit board 12c.

Further, according to the interposer 16e, the circuit module 11e, and the electronic device 10e, it is possible to separate the interposer 16e from the circuit board 12a. To be more specific, the interposer 16e is a small component and thus, it is difficult to mount the interposer 16e on the circuit board 12a with certainty. For this reason, there may be a case in which the mounted interposer 16e is desired to be separated from the circuit board 12a so as to correctly mount the interposer 16e on the circuit board 12a again.

In view of the above, the interposer 16e preferably includes the heating terminal 210, the heating conductors 212a, 212b, and the via hole conductors v110, v111. The heating conductor 212b is electrically connected with the heating terminal 210 through the heating conductor 212a and the via hole conductors v110, v111. In other words, the heating conductor 212b is connected to the heating terminal 210 through a member having higher thermal conductivity than the element body 60. With such a configuration, when the heating terminal 210 is heated by a soldering iron 250 as shown in FIG. 15, heat of the soldering iron 250 is transferred to the heating conductors 212a, 212b. The heating conductor 212a is provided in the vicinity of the wiring conductor 78k, and the heating conductor 212b is provided in the vicinity of the via hole conductors v101, v103. Accordingly, heat transferred to the heating conductors 212a, 212b is transferred to the wiring conductor 78k and the via hole conductors v101, v103 and, thereafter, is transferred to the interposer terminals 76a, 76b. Further, the heating conductor 212b is preferably provided in the element body 60 at a position closer to the lower surface than to the upper surface of the element body 60. Accordingly, the heating conductor 212b is positioned in the vicinity of the interposer terminals 76a to 76c. Therefore, heat transferred to the heating conductor 212b is transferred to the interposer terminals 76a to 76c. For this reason, solder fixed to the interposer terminals 76a to 76c is melted. As a result, the interposer 16e is separated from the circuit board 12a as shown in FIG. 16.

The heating terminal 210 may be heated in mounting the interposer 16e on the circuit board 12a.

Figure 17:
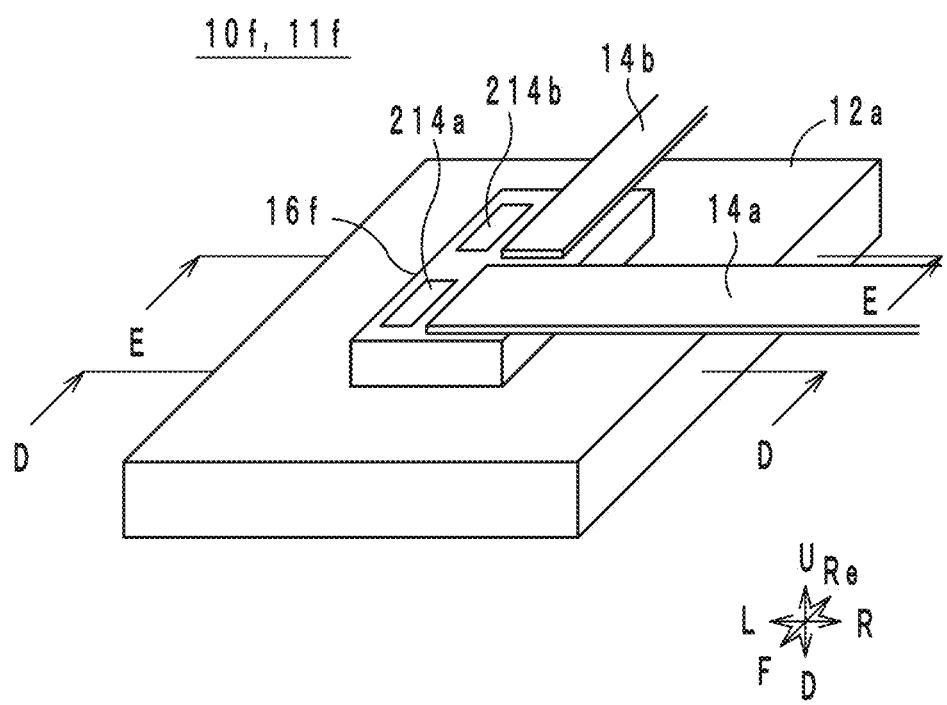
FIG. 17 is a perspective view of an electronic device 10f which includes an interposer 16f according to a preferred embodiment of the present invention.
Figure 18:
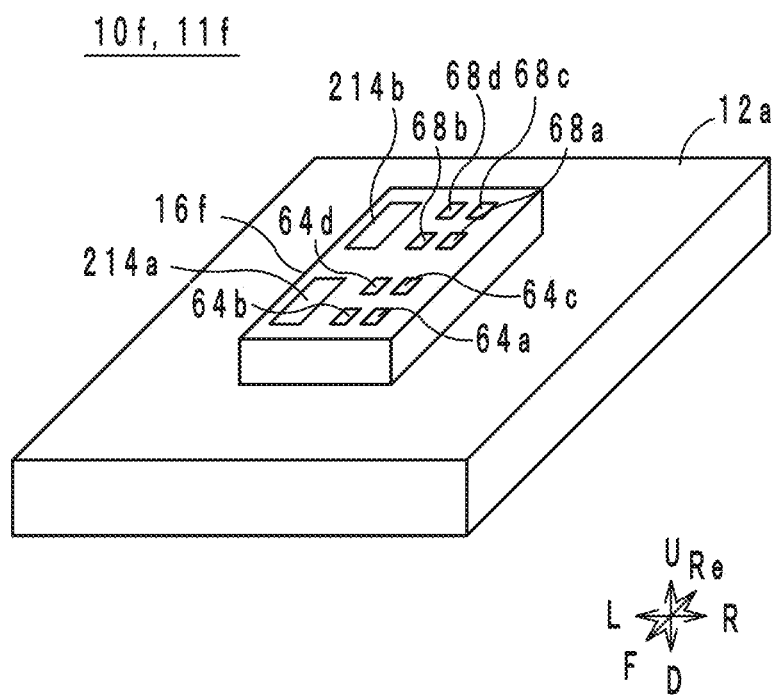
FIG. 18 is a perspective view of the electronic device 10f which includes the interposer 16f.

Hereinafter, an interposer 16f according to a sixth modification of a preferred embodiment of the present invention will be described with reference to drawings. FIG. 17 and FIG. 18 are perspective views of electronic device 10f which includes the interposer 16f. FIG. 18 shows a state where flat cables 14a, 14b are removed. FIG. 19 is a cross-sectional view taken along a line D-D in FIG. 17. FIG. 20 is a cross-sectional view taken along a line E-E in FIG. 17.

The interposer 16f preferably differs from the interposer 16e in terms of a fact that the interposer 16f includes heating terminals 214a, 214b, heating conductors 216a, 216b, and via hole conductors v120, v121 in place of the heating terminal 210, the heating conductors 212a, 212b, and the via hole conductors v110, v111.

The heating terminals 214a, 214b (one example of a second heating terminal) are provided on the surface other than the lower surface of an element body 60. In the present preferred embodiment, as shown in FIG. 17 and FIG. 18, the heating terminals 214a, 214b are provided on the upper surface of a ceramic layer 62a (the upper surface of the element body 60), and are positioned in a region on the left half of the upper surface of the ceramic layer 62a. The heating terminals 214a, 214b are arranged in this order from the front side to the rear side. The heating terminals 214a, 214b are preferably rectangular or substantially rectangular conductor layers which extend in the front-rear direction. The heating terminals 214a, 214b are not used for the connection between the flat cables 14a, 14b and the interposer 16f.

The heating conductor 216a (one example of a second heating conductor) is a conductor layer which is provided on the upper surface of a ceramic layer 62b. In FIG. 19, the heating conductor 216a is preferably divided into three members. This is to allow the heating conductor 216a to avoid via hole conductors v101, v102. Accordingly, the heating conductor 216a is one continuous body in cross section taken at a position different from the position of FIG. 19 in the front-rear direction. The heating conductor 216a is provided in the vicinity of the via hole conductors v101, v102. The heating conductor 216a is provided in the element body 60 at a position closer to the upper surface than to the lower surface of the element body 60. Further, the heating conductor 216a opposes interposer terminals 64a, 64b in the up-down direction.

The via hole conductor v120 penetrates the ceramic layer 62a in the up-down direction. The via hole conductor v120 connects the heating terminal 214a and the heating conductor 216a with each other. With such a configuration, the heating conductor 216a is electrically connected with the heating terminal 214a.

The heating conductor 216b is a conductor layer which is provided on the upper surface of the ceramic layer 62b. In FIG. 20, the heating conductor 216b is preferably divided into three members. This is to allow the heating conductor 216b to avoid via hole conductors v104, v105. Accordingly, the heating conductor 216b is one continuous body in cross section taken at a position different from the position of FIG. 20 in the front-rear direction. The heating conductor 216b is provided in the vicinity of the via hole conductors v104, v105. The heating conductor 216b is provided in the element body 60 at a position closer to the upper surface than to the lower surface of the element body 60. Further, the heating conductor 216b opposes interposer terminals 68c, 68d in the up-down direction.

The via hole conductor v121 penetrates the ceramic layer 62a in the up-down direction. The via hole conductor v121 connects the heating terminal 214b and the heating conductor 216b with each other. With such a configuration, the heating conductor 216b is electrically connected with the heating terminal 214b.

Other structures of the interposer 16f are preferably the same or substantially the same as the corresponding structures of the interposer 16e and thus, the description of other structures is omitted.

According to the interposer 16f, a circuit module 11f, and the electronic device 10f having the above-described configuration, for the same reason as the interposer 16, the circuit module 11, and the electronic device 10, it is possible to reduce the area of a region that connects the circuit boards 12a to 12c with the flat cables 14a, 14b. Further, according to the interposer 16f, the circuit module 11f, and the electronic device 10f, the number of flat cables is able to be reduced for the same reason as the interposer 16, the circuit module 11, and the electronic device 10. In the interposer 16f, the circuit module 11f, and the electronic device 10f, for the same or similar reason as the interposer 16, the circuit module 11, and the electronic device 10, it is also possible to further reduce an insertion loss which may be generated between the circuit board 12b and the circuit board 12c.

Further, according to the interposer 16f, the circuit module 11f, and the electronic device 10f, it is possible to separate the flat cables 14a, 14b from the interposer 16f. To be more specific, the interposer 16f is a small component and thus, it is difficult to connect the flat cables 14a, 14b to the interposer 16f with certainty. For this reason, there may be a case in which the flat cables 14a, 14b are desired to be separated from the interposer 16f so as to correctly connect the flat cables 14a, 14b to the interposer 16f again.

In view of the above, the interposer 16f preferably includes the heating terminal 214a, the heating conductor 216a, and the via hole conductor v120. The heating conductor 216a is electrically connected with the heating terminal 214a through the via hole conductor v120. In other words, the heating conductor 216a is connected to the heating terminal 214a through a member having higher thermal conductivity than the element body 60. With such a configuration, when the heating terminal 214a is heated by a soldering iron, heat of the soldering iron is transferred to the heating conductor 216a. The heating conductor 216a is provided in the vicinity of the via hole conductors v101, v102. Accordingly, heat transferred to the heating conductor 216a is transferred to the via hole conductors v101, v102 and, thereafter, is transferred to the interposer terminals 64a, 64b. Further, the heating conductor 216a is provided in the element body 60 at a position closer to the upper surface than to the lower surface of the element body 60. Accordingly, the heating conductor 216a is positioned in the vicinity of the interposer terminals 64a, 64b. Therefore, heat transferred to the heating conductor 216a is transferred to the interposer terminals 64a, 64b. For this reason, solder fixed to the interposer terminals 64a, 64b is melted. As a result, the flat cable 14a is separated from the interposer 16f.

The interposer 16f includes the heating terminal 214b, the heating conductor 216b, and the via hole conductor v121. The heating conductor 216b is electrically connected with the heating terminal 214b through the via hole conductor v121. In other words, the heating conductor 216b is connected to the heating terminal 214b through a member having higher thermal conductivity than the element body 60. With such a configuration, when the heating terminal 214b is heated by a soldering iron, heat of the soldering iron is transferred to the heating conductor 216b. The heating conductor 216b is provided in the vicinity of the via hole conductors v104, v105. Accordingly, heat transferred to the heating conductor 216b is transferred to the via hole conductors v104, v105 and, thereafter, is transferred to the interposer terminals 68c, 68d. Further, the heating conductor 216b is provided in the element body 60 at a position closer to the upper surface than to the lower surface of the element body 60. Accordingly, the heating conductor 216b is positioned in the vicinity of the interposer terminals 68c, 68d. Therefore, heat transferred to the heating conductor 216b is transferred to the interposer terminals 68c, 68d. For this reason, solder fixed to the interposer terminals 68c, 68d is melted. As a result, the flat cable 14b is separated from the interposer 16f.

The heating terminals 214a, 214b may be heated in connecting the flat cables 14a, 14b to the interposer 16f.

The heating terminals 214a, 214b may be connected with each other to form one heating terminal.

Figure 21:
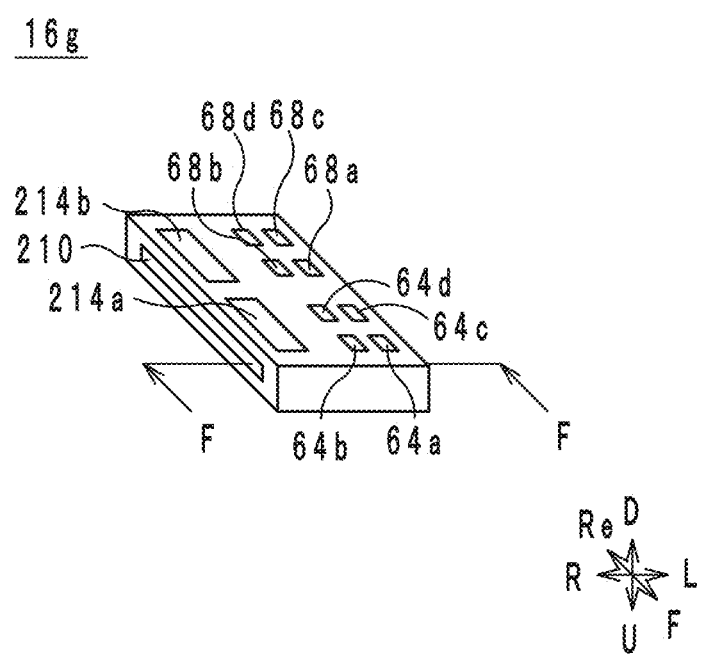
FIG. 21 is a perspective view of an interposer 16g according to a preferred embodiment of the present invention.

Hereinafter, an interposer 16g according to a seventh modification of a preferred embodiment of the present invention will be described with reference to drawings. FIG. 21 is a perspective view of the interposer 16g. FIG. 22 is a cross-sectional view of electronic device 10g which includes the interposer 16g. A cross-sectional view in FIG. 22 is a cross-sectional view taken along a line F-F in FIG. 21.

The interposer 16g preferably differs from the interposer 16f in terms of a fact that the interposer 16g further includes a heating terminal 210 and a heating conductor 220. The heating terminal 210 (one example of a first heating terminal) is provided on the surface other than the lower surface of an element body 60. In the present preferred embodiment, as shown in FIG. 21 and FIG. 22, the heating terminal 210 is provided on the left surface of the element body 60. The heating terminal 210 is not used for the connection between flat cables 14a, 14b and the interposer 16g.

The heating conductor 220 (one example of a first heating conductor) is a conductor layer which is provided on the upper surface of a ceramic layer 62d. In FIG. 22, the heating conductor 220 is preferably divided into three members. This is to allow the heating conductor 220 to avoid via hole conductors v101, v103. Accordingly, the heating conductor 220 is one continuous body in cross section taken at a position different from the position of FIG. 22 in the front-rear direction. The heating conductor 220 is provided in the vicinity of the via hole conductors v101, v103. The heating conductor 220 is provided in the element body 60 at a position closer to the lower surface than to the upper surface of the element body 60. Further, the heating conductor 220 opposes interposer terminals 76a to 76c in the up-down direction.

The heating conductor 220 extends to the left surface of the element body 60. Accordingly, the heating conductor 220 is connected to the heating terminal 210.

Other structures of the interposer 16g are preferably the same or substantially the same as the corresponding structures of the interposer 16f and thus, the description of other structures is omitted.

According to the interposer 16g, a circuit module 11g, and the electronic device 10g having the above-described configuration, for the same or similar reason as the interposer 16, the circuit module 11, and the electronic device 10, it is possible to reduce the area of a region that connects circuit boards 12a to 12c with the flat cables 14a, 14b. Further, according to the interposer 16g, the circuit module 11g, and the electronic device 10g, the number of flat cables is able to be reduced for the same reason as the interposer 16, the circuit module 11, and the electronic device 10. In the interposer 16g, the circuit module 11g, and the electronic device 10g, for the same or similar reason as the interposer 16, the circuit module 11, and the electronic device 10, it is also possible to further reduce an insertion loss which may be generated between the circuit board 12b and the circuit board 12c.

According to the interposer 16g, the circuit module 11g, and the electronic device 10g, for the same or similar reason as the interposer 16e, the circuit module 11e, and the electronic device 10e, it is also possible to separate the interposer 16f from the circuit board 12a.

According to the interposer 16g, the circuit module 11g, and the electronic device 10g, for the same or similar reason as the interposer 16f, the circuit module 11f, and the electronic device 10f, it is also possible to separate the flat cables 14a, 14b from the interposer 16g.

Further, according to the interposer 16g, the circuit module 11g, and the electronic device 10g, the heating terminals 214a, 214b and the heating terminal 210 are provided on different surfaces of the element body 60. Accordingly, it is possible to reduce or prevent a heating terminal to be heated from being erroneously selected.

Figure 23:
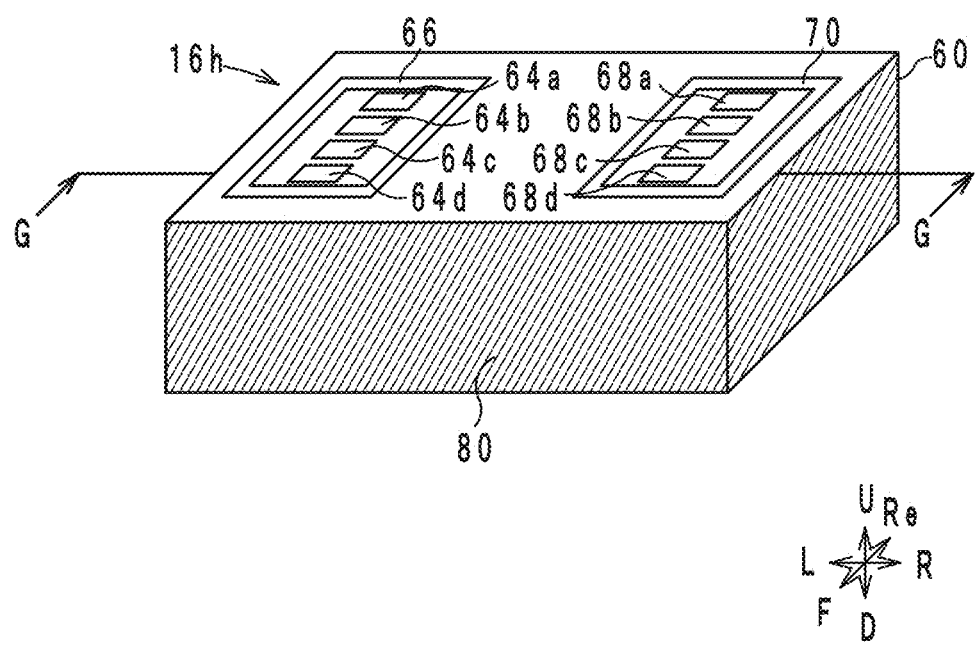
FIG. 23 is a perspective view showing an interposer 16h according to a preferred embodiment of the present invention.
Figure 24:
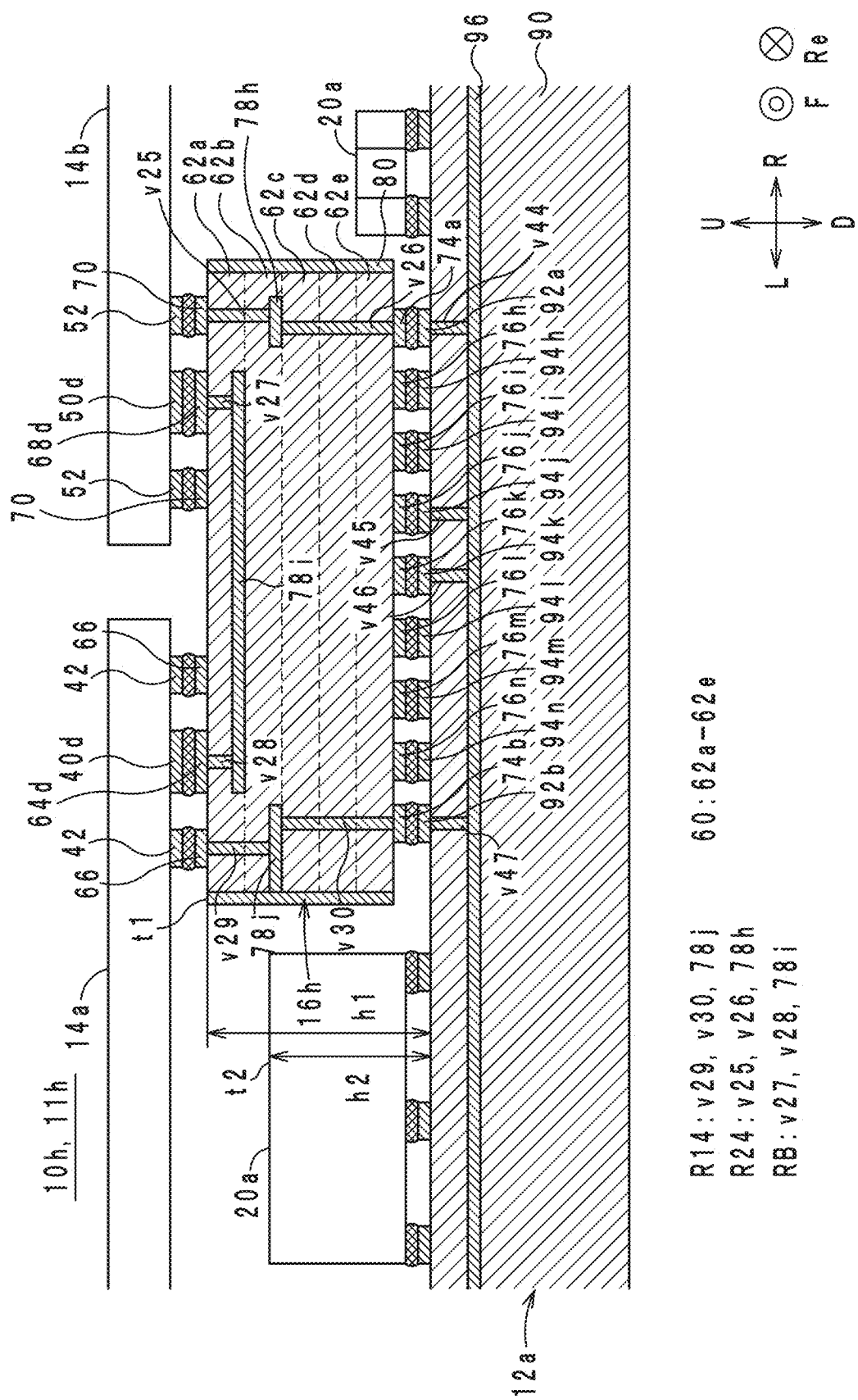
FIG. 24 is a cross-sectional view taken along a line G-G in FIG. 23.

Hereinafter, an interposer 16h according to an eighth modification of a preferred embodiment of the present invention will be described with reference to drawings. FIG. 23 is a perspective view showing the interposer 16h. FIG. 24 is a cross-sectional view taken along a line G-G in FIG. 23.

The interposer 16h preferably differs from the interposer 16 in terms of a fact that the interposer 16h further includes a metal shield 80. The metal shield 80 covers at least a portion of the side surfaces of an element body 60. In the interposer 16h, the metal shield 80 preferably covers the entire or substantially the entire side surfaces of the element body 60. Accordingly, the metal shield 80 extends along the side surfaces of the element body 60, thus having an annular shape as viewed from above.

Further, electronic components 20a (one example of a second electronic component) are mounted on the upper surface of a circuit board 12a, and are disposed adjacent to the interposer 16h. The description "electronic components 20a are disposed adjacent to the interposer 16h" means that only a space is present between the electronic component 20a and the interposer 16h, and there is no member, such as an electronic component, between the electronic component 20a and the interposer 16h. A portion of the metal shield 80 furthest from the upper surface of the circuit board 12a in the up-down direction is defined as a "first end portion t1". A portion of the electronic component 20a furthest from the upper surface of the circuit board 12a in the up-down direction is defined as a "second end portion t2". A distance h1 from the upper surface of the circuit board 12a to the first end portion t1 is longer than a distance h2 from the upper surface of the circuit board 12a to the second end portion t2. In other words, the metal shield 80 covers the side surfaces of the element body 60 of the interposer 16h to a position higher than the height of the electronic component 20a.

In the interposer 16h, a wiring conductor 78j extends to the left surface of the interposer 16h. Accordingly, the wiring conductor 78j is connected to the metal shield 80. As a result, the metal shield 80 is electrically connected with a ground conductor 96 through the wiring conductor 78j, a via hole conductor v30, an interposer terminal 74b, a circuit board terminal 92b, and a via hole conductor v47. Accordingly, the metal shield 80 is held at the ground potential.

Other structures of the interposer 16h are preferably the same or substantially the same as the corresponding structures of the interposer 16 and thus, the description of other structures is omitted.

According to the interposer 16h, a circuit module 11h, and electronic device 10h having the above-described configuration, for the same or similar reason as the interposer 16, the circuit module 11, and the electronic device 10, it is possible to reduce the area of a region that connects the circuit boards 12a to 12c with flat cables 14a, 14b. Further, according to the interposer 16h, the circuit module 11h, and the electronic device 10h, the number of flat cables is able to be reduced for the same reason as the interposer 16, the circuit module 11, and the electronic device 10.

Further, according to the interposer 16h, the circuit module 11h, and the electronic device 10h, it is possible to reduce or prevent the intrusion of noise from the outside to the inside of the interposer 16h, and it is also possible to reduce or prevent the emission of noise from the inside to the outside of the interposer 16h. To be more specific, in the interposer 16h, the metal shield 80 covers at least a portion of the side surfaces of the element body 60. The metal shield 80 is held at the ground potential. Accordingly, the metal shield 80 absorbs noise which may enter the interposer 16h from the outside of the interposer 16h. The metal shield 80 also absorbs noise which may be emitted from the inside to the outside of the interposer 16h. As a result, according to the interposer 16h, the circuit module 11h, and the electronic device 10h, it is possible to reduce or prevent the intrusion of noise from the outside to the inside of the interposer 16h, and it is also possible to reduce or prevent the emission of noise from the inside to the outside of the interposer 16h. Therefore, the electronic component 20a is able to be disposed in the vicinity of the interposer 16h, thus allowing the reduction in size of the circuit module 11h and the electronic device 10h.

In the interposer 16h, the metal shield 80 extends along the side surfaces of the element body 60 to surround as viewed from above. Accordingly, the metal shield 80 is able to absorb noise which may enter the interposer 16h from the front-rear direction or the right-left direction of the interposer 16h. The metal shield 80 is also able to absorb noise emitted in the front-rear direction or the right-left direction of the interposer 16h. The metal shield 80 is disposed to cover the side surfaces of the element body 60 by enclosing with one turn and thus, magnetic flux leaking from surfaces other than the side surfaces of the element body 60 which oppose components defines a loop. Accordingly, it is possible to reduce or prevent that magnetic flux interferes with the components.

The distance h1 from the upper surface of the circuit board 12a to the first end portion t1 is longer than the distance h2 from the upper surface of the circuit board 12a to the second end portion t2. In other words, the metal shield 80 covers the side surfaces of the element body 60 of the interposer 16h to a position higher than the height of the electronic component 20a. With such a configuration, it is possible to reduce or prevent that the interposer 16h is affected by noise from the electronic component 20a, and it is possible to reduce or prevent that the electronic component 20a is affected by noise from the interposer 16h.

Figure 25:
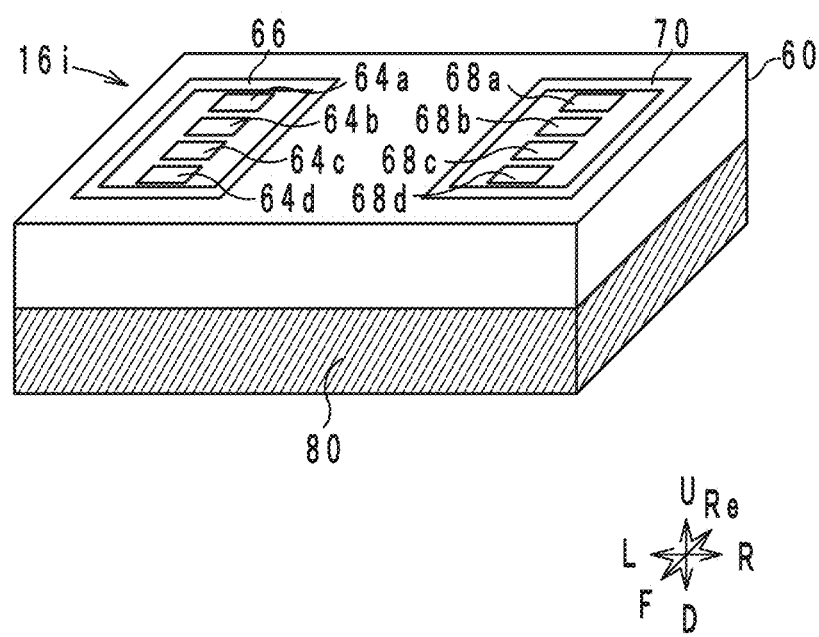
FIG. 25 is a perspective view showing an interposer 16i according to a preferred embodiment of the present invention.

Hereinafter, an interposer 16i according to a ninth modification of a preferred embodiment of the present invention will be described with reference to a drawing. FIG. 25 is a perspective view showing the interposer 16i.

The interposer 16i preferably differs from the interposer 16h in terms of the structure of a metal shield 80. To be more specific, in the interposer 16i, the metal shield 80 covers the lower half of the side surfaces of an element body 60. Other structures of the interposer 16i are preferably the same or substantially the same as the corresponding structures of the interposer 16h and thus, the description of other structures is omitted.

According to the interposer 16i having the above-described configuration, for the same or similar reason as the interposer 16h, it is possible to reduce the area of a region that connects circuit boards 12a to 12c with flat cables 14a, 14b. According to the interposer 16i, the number of flat cables is able to be reduced for the same or similar reason as the interposer 16h. Further, according to the interposer 16i, for the same or similar reason as the interposer 16h, it is possible to reduce or prevent the intrusion of noise from the outside to the inside of the interposer 16i, and it is also possible to reduce or prevent the emission of noise from the inside to the outside of the interposer 16i. In the interposer 16i, for the same or similar reason as the interposer 16h, the metal shield 80 is able to absorb noise which may enter the interposer 16i from the front-rear direction or the right-left direction of the interposer 16i. The metal shield 80 is also able to absorb noise emitted in the front-rear direction or the right-left direction of the interposer 16i. The metal shield 80 covers the side surfaces of the element body 60 by enclosing with one turn and thus, magnetic flux leaking from surfaces other than the side surfaces of the element body 60 which oppose components defines a loop. Accordingly, it is possible to reduce or prevent that magnetic flux interferes with the components.

Further, according to the interposer 16i, the metal shield 80 covers a portion of the side surface of the element body 60. Accordingly, it is possible to reduce or prevent that a parasitic capacitance is generated between the metal shield 80 and a circuit in the interposer 16i.

Figure 26:
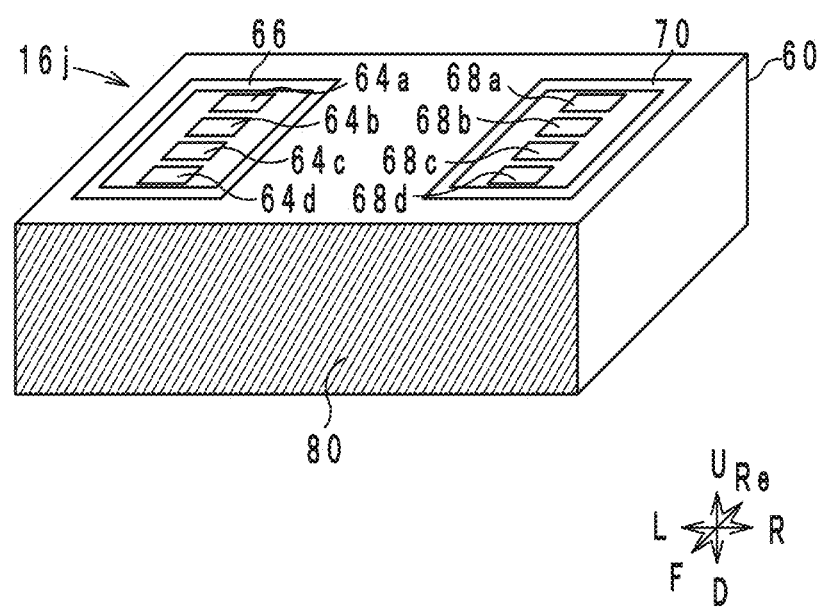
FIG. 26 is a perspective view showing an interposer 16j according to a preferred embodiment of the present invention.

Hereinafter, an interposer 16j according to a tenth modification of a preferred embodiment of the present invention will be described with reference to a drawing. FIG. 26 is a perspective view showing the interposer 16j.

The interposer 16j preferably differs from the interposer 16h in terms of the structure of a metal shield 80. To be more specific, in the interposer 16j, the metal shield 80 covers only the front surface of an element body 60. Other structures of the interposer 16j are the same or substantially the same as the corresponding structures of the interposer 16h and thus, the description of other structures is omitted.

According to the interposer 16j having the above-described configuration, for the same or similar reason as the interposer 16h, it is possible to reduce the area of a region that connects circuit boards 12a to 12c with flat cables 14a, 14b. According to the interposer 16j, the number of flat cables is able to be reduced for the same reason as the interposer 16h. Further, according to the interposer 16j, for the same or similar reason as the interposer 16h, it is possible to reduce or prevent the intrusion of noise from the outside to the inside of the interposer 16i, and it is also possible to reduce or prevent the emission of noise from the inside to the outside of the interposer 16i.

Further, according to the interposer 16j, the metal shield 80 covers a portion of the side surfaces of the element body 60. Accordingly, it is possible to reduce or prevent that a parasitic capacitance is generated between the metal shield 80 and a circuit in the interposer 16j.

Figure 27:
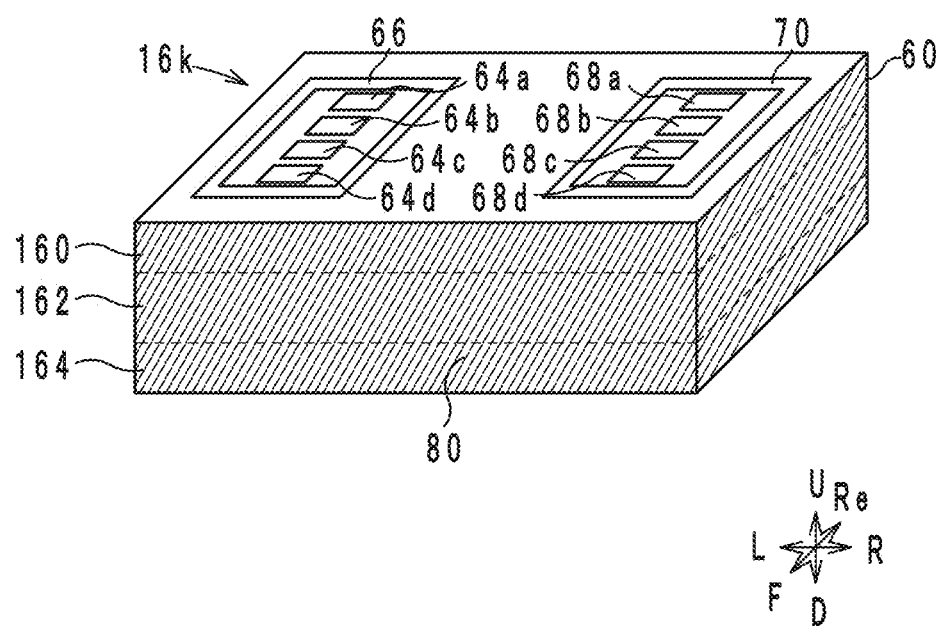
FIG. 27 is a perspective view showing an interposer 16k according to a preferred embodiment of the present invention.

Hereinafter, an interposer 16k according to an eleventh modification of a preferred embodiment of the present invention will be described with reference to a drawing. FIG. 27 is a perspective view showing the interposer 16k.

The interposer 16k preferably differs from the interposer 16h in terms of the structure of an element body 60. To be more specific, the element body 60 of the interposer 16h is preferably made of a single material. A material used to make the element body 60 of the interposer 16h may preferably be a magnetic material or a non-magnetic material, for example. On the other hand, the element body 60 of the interposer 16k is preferably made of a plurality of kinds of materials. The element body 60 of the interposer 16k preferably includes a non-magnetic portion 160, a magnetic portion 162, and a non-magnetic portion 164. The non-magnetic portion 160, the magnetic portion 162, and the non-magnetic portion 164 are stacked so as to be arranged in this order from the top to the bottom. Other structures of the interposer 16k are preferably the same or substantially the same as the corresponding structures of the interposer 16h and thus, the description of other structures is omitted.

According to the interposer 16k having the above-described configuration, for the same or similar reason as the interposer 16h, it is possible to reduce the area of a region that connects circuit boards 12a to 12c with flat cables 14a, 14b. According to the interposer 16k, the number of flat cables is able to be reduced for the same reason as the interposer 16h. Further, according to the interposer 16k, for the same or similar reason as the interposer 16h, it is possible to reduce or prevent the intrusion of noise from the outside to the inside of the interposer 16k, and it is also possible to reduce or prevent the emission of noise from the inside to the outside of the interposer 16k. In the interposer 16k, for the same or similar reason as the interposer 16h, a metal shield 80 is able to absorb noise which may enter the interposer 16k from the front-rear direction or the right-left direction of the interposer 16k. The metal shield 80 is also able to absorb noise emitted in the front-rear direction or the right-left direction of the interposer 16k. The metal shield 80 covers the side surfaces of the element body 60 by enclosing with one turn and thus, magnetic flux leaking from surfaces other than the side surfaces of the element body 60 which oppose components forms a loop. Accordingly, it is possible to reduce or prevent that magnetic flux interferes with the components.

According to the interposer 16k, the circuit in the interposer 16k defines and functions as a bead inductor.

Further, according to the interposer 16k, the magnetic portion 162 is covered by the metal shield 80 so that magnetic flux is enclosed in the element body 60.

The interposer 16k may not include the metal shield 80.

Figure 28:
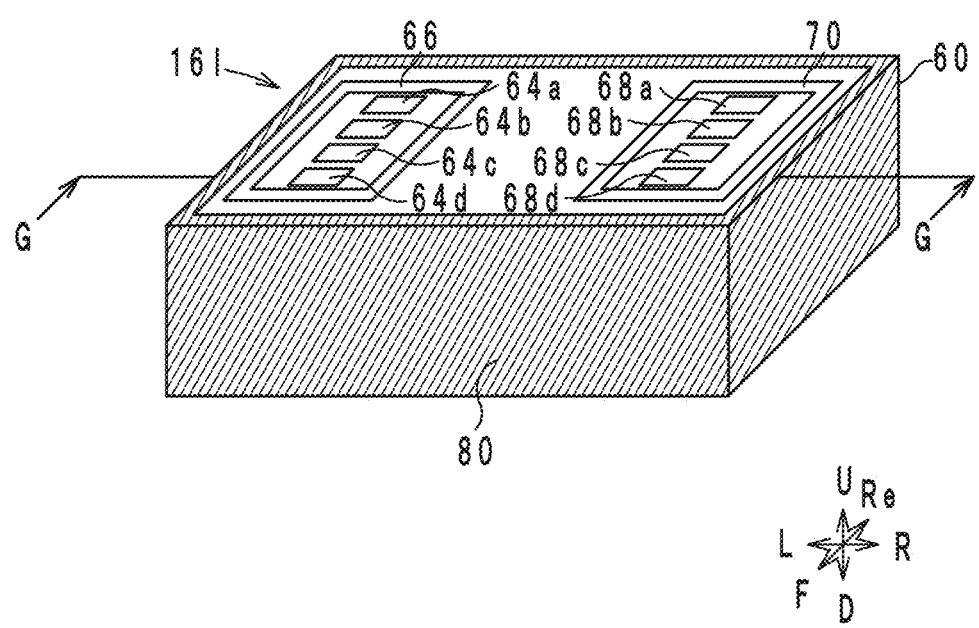
FIG. 28 is a perspective view showing an interposer 16l according to a preferred embodiment of the present invention.

Hereinafter, an interposer 16l according to a twelfth modification of a preferred embodiment of the present invention will be described with reference to a drawing. FIG. 28 is a perspective view showing the interposer 16l.

The interposer 16l preferably differs from the interposer 16h in terms of the structure of a metal shield 80. To be more specific, in the interposer 16l, the metal shield 80 covers the entire or substantially the entire side surfaces of an element body 60, and is provided on the upper surface of an element body 60 such that the metal shield 80 has a band shape along the outer edge of the upper surface of the element body 60. Other structures of the interposer 16l are preferably the same or substantially the same as the corresponding structures of the interposer 16h and thus, the description of other structures is omitted.

According to the interposer 16l having the above-described configuration, for the same or similar reason as the interposer 16h, it is possible to reduce the area of a region that connects circuit boards 12a to 12c with flat cables 14a, 14b. According to the interposer 16l, the number of flat cables is able to be reduced for the same or similar reason as the interposer 16h. Further, according to the interposer 16l, for the same or similar reason as the interposer 16h, it is possible to reduce or prevent the intrusion of noise from the outside to the inside of the interposer 16l, and it is also possible to reduce or prevent the emission of noise from the inside to the outside of the interposer 16l. In the interposer 16l, for the same or similar reason as the interposer 16h, the metal shield 80 is able to absorb noise which may enter the interposer 16l from the front-rear direction or the right-left direction of the interposer 16l. The metal shield 80 is also able to absorb noise emitted in the front-rear direction or the right-left direction of the interposer 16l. The metal shield 80 covers the side surfaces of the element body 60 by enclosing with one turn and thus, magnetic flux leaking from surfaces other than the side surfaces of the element body 60 which oppose components define a loop. Accordingly, it is possible to reduce or prevent that magnetic flux interferes with the components.

The interposer, the circuit module, and the electronic device according to the present invention are not limited to the preferred embodiments of the interposers 16, 16a to 16l, the circuit modules 11, 11a to 11h, and the electronic devices 10, 10a to 10h, and various modifications are conceivable without departing from the gist of the present invention.

The respective configurations of the interposers 16, 16a to 16l, the circuit modules 11, 11a to 11h, and the electronic device 10, 10a to 10h may be combined with each other as desired.

Further, in the circuit modules 11, 11a to 11h and the electronic device 10, 10a to 10h, the interposer terminal and the cable terminal are connected with each other by solder. However, the interposer terminal and the cable terminal may be connected with each other by a conductive bonding member other than solder. The conductive bonding member other than solder may be a conductive adhesive agent, an anisotropic conductive film or the like. Alternatively, the interposer terminal and the cable terminal may be in direct contact with each other without via the conductive bonding member. In this case, the interposer terminal and the cable terminal are pressure-bonded so that the interposer terminal and the cable terminal are metallically bonded at the interface between the interposer terminal and the cable terminal.

Further, in the circuit modules 11, 11a to 11h and the electronic devices 10, 10a to 10h, the interposer terminal and the circuit board terminal are connected with each other by solder. However, the interposer terminal and the circuit board terminal may be connected with each other by a conductive bonding member other than solder. The conductive bonding member other than solder may be a conductive adhesive agent, for example. Alternatively, the interposer terminal and the circuit board terminal may be in direct contact with each other without via the conductive bonding member. In this case, the interposer terminal and the circuit board terminal are pressure-bonded so that the interposer terminal and the circuit board terminal are metallically bonded at the interface between the interposer terminal and the circuit board terminal.

The circuit module 11 and the electronic device 10 may include only any one of the wirings R11 to R13 (first wiring) and the wirings R21 to R23 (second wiring). Even in the case in which the circuit module 11 and the electronic device 10 include only any one of the wirings R11 to R13 (first wiring) and the wirings R21 to R23 (second wiring), it is possible to reduce the area of a region that connects circuit boards 12a to 12c with the flat cables 14a, 14b. Hereinafter, the description will be provided with reference to an example of the case in which wirings R11 to R13 are provided, but wirings R21 to R23 are not provided. FIG. 29 is a view of an interposer 16 as viewed from above. FIG. 30 is a view of guide members 518a, 518b as viewed from above.

In the case in which the wirings R21 to R23 are not provided to the interposer 16, the circuit boards 12a to 12c have the following connection relationship. The circuit board 12a and the circuit board 12b are electrically connected with each other by the flat cable 14a. Further, the circuit board 12b and the circuit board 12c are electrically connected with each other by the flat cables 14a, 14b and the interposer 16. However, the circuit board 12a and the circuit board 12c are not electrically connected with each other. In this case, three interposers 16, 18a, 18b are used.

When the above-described connection relationship is realized in the circuit module 511 and the electronic device 510 according to the Comparative Example of the present invention shown in FIG. 6, the flat cable 514b and the guide members 518c, 518d are unnecessary. Accordingly, the circuit board 512a and the circuit board 512b are electrically connected with each other through the flat cable 514a. Further, the circuit board 512b and the circuit board 512c are electrically connected with each other through the flat cable 514c. In this case, four guide members 518a, 518b, 518e, 518f are used.

The size relationship between the mounting areas of the three interposers 16, 18a, 18b and the mounting areas of the four guide members 518a, 518b, 518e, 518f will now be described. Hereinafter, the mounting areas of the interposers 16, 18a, 18b and the areas of the interposers 16, 18a, 18b are used in a distinguished manner. To be more specific, the mounting areas of the interposers 16, 18a, 18b are the areas of regions that mount the interposers 16, 18a, 18b. The regions that mount the interposers 16, 18a, 18b include the interposers 16, 18a, 18b and regions around the interposers 16, 18a, 18b. On the other hand, the areas of the interposers 16, 18a, 18b are the areas of the interposers 16, 18a, 18b as viewed from above in a plan view. The same definition as the mounting areas of the interposers 16, 18a, 18b and the areas of the interposers 16, 18a, 18b is also applied to the mounting areas of the guide members 518a, 518b, 518e, 518f and the areas of the guide members 518a, 518b, 518e, 518f.

One flat cable 14a is connected to the interposer 18a, and one flat cable 14b is connected to the interposer 18b. Accordingly, the interposer 18a, 18b is required to have an area which allows one flat cable 14a, 14b to be connected to the interposer 18a, 18b. On the other hand, one flat cable 514c is connected to each of the guide members 518e, 518f. Accordingly, the guide member 518e, 518f is required to have an area which allows the one flat cable 514c to be connected to the guide member 518e, 518f. The sum of the areas of the interposers 18a, 18b and the sum of the areas of the guide members 518e, 518f are preferably equal or substantially equal to each other. As a result, the sum of the mounting areas of the interposers 18a, 18b and the sum of the mounting areas of the guide members 518e, 518f are preferably equal or substantially equal to each other. Accordingly, the size relationship between the mounting areas of the three interposers 16, 18a, 18b and the mounting areas of the four guide members 518a, 518b, 518e, 518f is determined according to the size relationship between the mounting area of the interposer 16 and the mounting areas of the guide members 518a, 518b.

Two flat cables 14a, 14b are connected to the interposer 16. Accordingly, the interposer 16 is required to have an area which allows the two flat cables 14a, 14b to be connected to the interposer 16. On the other hand, one flat cable 514a is connected to each of the guide members 518a, 518b. Accordingly, the guide member 518a, 518b is required to have an area which allows the one flat cable 514a to be connected to the guide member 518a, 518b. Therefore, the area of the interposer 16 and the sum of the areas of the guide members 518a, 518b are equal or substantially equal to each other.

The mounting area of the interposer 16 is preferably larger than the area of the interposer 16. To be more specific, to prevent short-circuiting between the interposer 16 and electronic components disposed around the interposer 16, as shown in FIG. 29, the electronic components cannot be disposed in a region A1 disposed around the interposer 16. Accordingly, the mounting area of the interposer 16 is the sum of the area of the interposer 16 and the area of the region A1.

The mounting area of the guide members 518a, 518b is preferably larger than the sum of the areas of the guide members 518a, 518b. To be more specific, to prevent short-circuiting between the guide member 518a and electronic components disposed around the guide member 518a, as shown in FIG. 30, the electronic components cannot be disposed in a region A2 disposed around the guide member 518a. Accordingly, the mounting area of the guide member 518a is the sum of the area of the guide member 518a and the area of the region A2. In the same manner, the mounting area of the guide member 518b is the sum of the area of the guide member 518b and the area of a region A3.

The area of the interposer 16 is preferably equal or substantially equal to the sum of the areas of the guide members 518a, 518b. Further, as can be seen from FIG. 29 and FIG. 30, the sum of the areas of the regions A2, A3 is preferably larger than the area of the region A1. Accordingly, the mounting area of the interposer 16 is smaller than the mounting areas of the guide members 518a, 518b. For the above-described reasons, even in the case in which only any one of the wirings R11 to R13 (first wiring) and the wirings R21 to R23 (second wiring) is provided, it is possible to reduce the area of a region that connects the circuit boards 12a to 12c with the flat cables 14a, 14b.

The interposer 16, 16a to 16l may include a passive component defined by a wiring conductor and a via hole conductor. The passive component may preferably be a capacitor, an inductor, a resistor or the like, for example. However, the interposer 16, 16a to 16l does not incorporate an active component, such as an IC. Further, an active component is not mounted on the interposer 16, 16a to 16l.

In the electronic device 10b, the circuit board terminal 97 may be connected to the ground conductor 96 through the via hole conductor. In this case, the bypass wiring RB is electrically connected to the ground conductor 96.

The circuit module 11 includes the circuit boards 12a to 12c, the flat cables 14a, 14b, the interposers 16, 18a, 18b, the plurality of electronic components 20a, the plurality of electronic components 20b, and the plurality of electronic components 20c. However, it is sufficient that the circuit module 11 includes at least the circuit board 12a and the interposer 16. The same definition as the circuit module 11 is applied to the circuit modules 11a to 11h.

An external element other than the flat cable may be connected to the interposer 16, 16a to 16l. The external element other than the flat cable may be a large-sized circuit board having flexibility, a hard circuit board having no flexibility or the like, for example.

While preferred embodiments and modified examples of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An interposer used in a circuit module including a circuit board including a main surface, a first external element, and a second external element, the interposer comprising:
    an element body including a first surface;
    a first interposer terminal and a third interposer terminal provided on the first surface and connected to the first external element;
    a second interposer terminal and a fourth interposer terminal provided on the first surface and connected to the second external element;
    both of a first wiring and a second wiring, the first wiring being provided in the element body and/or on a surface of the element body, and electrically connecting the first interposer terminal and the circuit board with each other, and the second wiring being provided in the element body and/or on the surface of the element body, and electrically connecting the second interposer terminal and the circuit board with each other; and
    a bypass wiring provided in the element body and/or on a surface of the element body, and electrically connecting the third interposer terminal and the fourth interposer terminal with each other; wherein
    no second bypass wiring is provided in or on the element body and electrically connecting a ground conductor of the first external element and a ground conductor of the second external element with each other;
    the third interposer terminal and the fourth interposer terminal do not electrically connect to the circuit board by wiring located in the element body;
    the third interposer terminal is electrically connected to a signal line of the first external element and is not electrically connected to a ground terminal of the first external element;
    the third interposer terminal is not connected to a ground terminal of the interposer;
    the element body includes a mounting surface and a top surface defining the first surface, the mounting surface and the top surface being opposite to each other;
    the mounting surface opposes the main surface of the circuit board, and is located closer to the main surface than to the top surface in a direction in which the mounting surface opposes the main surface; and
    the first external element and the second external element include a ground conductor not connected to the bypass wiring and connected to the circuit board.

2. A circuit module comprising:
    a circuit board including a main surface; and
    an interposer mounted on the main surface of the circuit board; wherein
    the interposer includes:
        an element body including a first surface;
        a first interposer terminal and a third interposer terminal provided on the first surface of the element body and connected to a first external element;
        a second interposer terminal and a fourth interposer terminal provided on the first surface of the element body and connected to a second external element;
        both of a first wiring and a second wiring, the first wiring being provided in the element body and/or on a surface of the element body, and electrically connecting the first interposer terminal and the circuit board with each other, and the second wiring being provided in the element body and/or on the surface of the element body, and electrically connecting the second interposer terminal and the circuit board with each other; and
        a bypass wiring provided in the element body and/or on a surface of the element body, and electrically connecting the third interposer terminal and the fourth interposer terminal with each other;
    no second bypass wiring is provided in or on the element body and electrically connecting a ground conductor of the first external element and a ground conductor of the second external element with each other;
    the third interposer terminal and the fourth interposer terminal do not electrically connect to the circuit board by wiring located in the element body;
    the third interposer terminal is electrically connected to a signal line of the first external element and is not electrically connected to a ground terminal of the first external element;
    the third interposer terminal is not connected to a ground terminal of the interposer;
    the element body includes a mounting surface and a top surface defining the first surface, the mounting surface and the top surface being opposite to each other;
    the mounting surface opposes the main surface of the circuit board, and is located closer to the main surface than to the top surface in a direction in which the mounting surface opposes the main surface; and
    the first external element and the second external element include a ground conductor not connected to the bypass wiring and connected to the circuit board.

3. An interposer used in a circuit module including a circuit board including a main surface, a first external element, and a second external element, the interposer comprising:
    an element body including a first surface;
    a first interposer terminal and a third interposer terminal provided on the first surface and connected to the first external element;
    a second interposer terminal and a fourth interposer terminal provided on the first surface and connected to the second external element;
    at least one of a first wiring and a second wiring, the first wiring being provided in the element body and/or on a surface of the element body, and electrically connecting the first interposer terminal and the circuit board with each other, and the second wiring being provided in the element body and/or on the surface of the element body, and electrically connecting the second interposer terminal and the circuit board with each other; and
    a bypass wiring provided in the element body and/or on a surface of the element body, and electrically connecting the third interposer terminal and the fourth interposer terminal with each other; wherein
    no second bypass wiring is provided in or on the element body and electrically connecting a ground conductor of the first external element and a ground conductor of the second external element with each other;
a first ground terminal is disposed so as to surround the first and third interposer terminals and a second ground terminal is disposed so as to surround the second and fourth interposer terminals;
the third interposer terminal is electrically connected to a signal line of the first external element and is not electrically connected to a ground terminal of the first external element;—
the third interposer terminal is not connected to a ground terminal of the interposer;
the element body includes a mounting surface and a top surface defining the first surface, the mounting surface and the top surface being opposite to each other;
the mounting surface opposes the main surface of the circuit board, and is located closer to the main surface than to the top surface in a direction in which the mounting surface opposes the main surface; and
the first external element and the second external element include a ground conductor not connected to the bypass wiring and connected to the circuit board.

4. A circuit module comprising:
a circuit board including a main surface; and
an interposer mounted on the main surface of the circuit board; wherein
the interposer includes:
an element body including a first surface;
a first interposer terminal and a third interposer terminal provided on the first surface of the element body and connected to a first external element;
a second interposer terminal and a fourth interposer terminal provided on the first surface of the element body and connected to a second external element;
at least one of a first wiring and a second wiring, the first wiring being provided in the element body and/or on a surface of the element body, and electrically connecting the first interposer terminal and the circuit board with each other, and the second wiring being provided in the element body and/or on the surface of the element body, and electrically connecting the second interposer terminal and the circuit board with each other; and
a bypass wiring provided in the element body and/or on a surface of the element body, and electrically connecting the third interposer terminal and the fourth interposer terminal with each other;
no second bypass wiring is provided in or on the element body and electrically connecting a ground conductor of the first external element and a ground conductor of the second external element with each other;
a first ground terminal is disposed so as to surround the first and third interposer terminals and a second ground terminal is disposed so as to surround the second and fourth interposer terminals;
the third interposer terminal is electrically connected to a signal line of the first external element and is not electrically connected to a ground terminal of the first external element;—
the third interposer terminal is not connected to a ground terminal of the interposer;
the element body includes a mounting surface and a top surface defining the first surface, the mounting surface and the top surface being opposite to each other;
the mounting surface opposes the main surface of the circuit board, and is located closer to the main surface than to the top surface in a direction in which the mounting surface opposes the main surface; and
the first external element and the second external element include a ground conductor not connected to the bypass wiring and connected to the circuit board.

* * * * *